(12) United States Patent
Fujii et al.

(10) Patent No.: US 7,756,600 B2
(45) Date of Patent: Jul. 13, 2010

(54) METHOD FOR MANUFACTURING SEMICONDUCTOR DEVICE

(75) Inventors: Gen Fujii, Kanagawa (JP); Eiji Sato, Kanagawa (JP); Shigeru Onoya, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 932 days.

(21) Appl. No.: 11/522,843

(22) Filed: Sep. 18, 2006

(65) Prior Publication Data

US 2007/0065957 A1 Mar. 22, 2007

(30) Foreign Application Priority Data

Sep. 22, 2005 (JP) .............................. 2005-275075

(51) Int. Cl.
*G06F 19/00* (2006.01)
(52) U.S. Cl. ...................... 700/121; 700/117; 700/159
(58) Field of Classification Search ................. 700/121, 700/159, 117, 118, 119
See application file for complete search history.

(56) References Cited

U.S. PATENT DOCUMENTS 6,557,964 B2   5/2003   Kawatoko et al.
6,609,845 B1   8/2003   Ninomiya
2005/0005799 A1   1/2005   Hirai

FOREIGN PATENT DOCUMENTS

| JP | 2001-030478 | 2/2001 |
| JP | 2002-029097 | 1/2002 |
| JP | 2005-012179 | 1/2005 |

*Primary Examiner*—Paul L Rodriguez
*Assistant Examiner*—Nathan Laughlin
(74) *Attorney, Agent, or Firm*—Husch Blackwell Sanders LLP

(57) ABSTRACT

In the case of forming fine wires and the like by a droplet discharging apparatus to manufacture electric circuits, discharging controls including controls of a discharging position, a discharging timing, and the like are required to have very high accuracy. After forming design diagram data of an electric circuit by a CAD tool, the design diagram data is converted into first raster data, which is then converted into second raster data. The first raster data is a square grid regarding a dot pitch Xdp in a horizontal direction and a dot pitch Ydp in a perpendicular direction as one unit. The second raster data is a rectangular grid regarding the dot pitch Xdp in the horizontal direction and a dot pitch Ydp/V (V>1) as one unit. It is to be noted that arbitrary discharging number is the same before and after the conversion from the first raster data to the second raster data.

44 Claims, 24 Drawing Sheets

METHOD FOR MANUFACTURING SEMICONDUCTOR DEVICE

BACKGROUND OF THE INVENTION

1. Field of the Invention

The present invention relates to a semiconductor device having a circuit which includes a thin film transistor (hereinafter called a TFT), and a manufacturing method thereof. For example, the present invention relates to an electronic appliance in which an electro-optic device typified by a liquid crystal display panel or a light-emitting display device having an organic light-emitting element is mounted as a part thereof.

In this specification, the semiconductor device includes general semiconductor devices that can function by using semiconductor characteristics, and an electro-optical device, a semiconductor circuit, and an electronic appliance are all included in the semiconductor device.

2. Description of the Related Art

In recent years, attention has been focused on a technique for forming a thin film transistor (TFT) using a semiconductor thin film (with a thickness of about several nanometers to several hundred nanometers) formed over a substrate having an insulating surface. Thin film transistors are widely applied to electronic devices such as an IC and an electro-optical device. In particular, development is urgently required on thin film transistors as switching elements of image display devices.

In manufacturing of an electronic appliance having a semiconductor circuit, a mother glass substrate is used instead of a wafer substrate in order to improve efficiency for mass production, and a plurality of devices are often taken from one mother glass substrate. A mother glass substrate has a size of 300×400 mm for the first generation in the beginning of 1990, which has grown to 680×880 mm or 730×920 mm for the fourth generation in 2000. Production techniques have progressed so that a number of devices, typically display panels, can be taken from one substrate.

From now, in a film-forming method using a spin coating method, the increase in size of a substrate will be disadvantageous in mass production because a mechanism for rotating a large substrate becomes large, and loss and waste amount of a material liquid increase. Moreover, when a film is formed by spin-coating a rectangular substrate, circular unevenness with a rotating axis as a center is likely to appear on the film.

A droplet discharging technique typified by a piezo method or a thermal jet method, or a serial droplet discharging technique has attracted attention in recent years. This droplet discharging technique has been used in printing type and drawing an image on paper. Patent Document 1 discloses a technique for suppressing the displacement of a dot formation position and preventing deterioration of image quality by the use of a printing device having functions of a printer, a copier, a facsimile machine, and the like. Moreover, Patent Document 2 discloses a technique for recording an image in accordance with a head attachment angle θ at which the head is tilted to a straight line perpendicular to a direction where paper is to be delivered.

An attempt to apply a droplet discharging technique to a semiconductor field such as micropattern formation, which is completely different from a field of printing to paper or the like, has begun in recent years. For example, a method for forming a micropattern over a glass substrate by a droplet discharging technique is disclosed in Patent Document 3.

[Patent Document 1]
Japanese Patent Laid-Open No. 2002-29097

[Patent Document 2]
Japanese Patent Laid-Open No. 2001-30478

[Patent Document 3]
Japanese Patent Laid-Open No. 2005-12179

SUMMARY OF THE INVENTION

When a semiconductor device is to be manufactured, first, masks are designed by a CAD tool. This mask design is a design to manufacture masks with which various materials are stacked to form layers by a sputtering method, a CVD method, or the like and the layers are etched selectively.

A droplet discharging apparatus not using masks, typically an ink jet apparatus, controls a discharging position of a material droplet based on raster data which is obtained by binarizing data and which decides whether a material is discharged or not. It is difficult to understand a circuit structure and a wire position just by this raster data. Moreover, circuit design is also difficult just by raster data from the beginning.

Therefore, even in the case of forming a wire or a resist mask by using an ink jet apparatus, it is desirable that after designing the whole semiconductor device by a CAD tool, its CAD data be converted into raster data (raster data utilized in the step of using the ink jet apparatus).

An ink jet apparatus determines dot diameter d based on discharging capacity of a head, a material droplet discharged from a nozzle, a surface condition of a substrate, or the like. The material droplet only needs to have fluidity (viscosity) that can be discharged from a nozzle or the like and to be a fluid body as the whole droplet even if a solid substance is mixed therein. An ink jet apparatus has a plurality of nozzles in one head. Scanning is carried out by relatively moving the head and the substrate to be processed, and whether the material droplet is discharged from a nozzle or not is selected. For example, scanning may be carried out by moving the substrate to be processed with the head fixed, or by fixing the substrate to be processed with the head moved.

One ink jet apparatus may be provided with a plurality of heads. By providing a plurality of heads, a larger area can be processed and the time required for the entire steps can be shortened.

When a plurality of lines are drawn in a scanning direction, an interval at which favorable lines can be formed (dot pitch dp in a direction perpendicular (or parallel) to the scanning direction) is in the range of about 0.5 to 0.9 times the dot diameter d.

The CAD data is divided, regarding an area with this dot pitch dp on one side (dot pitch Xdp in a direction perpendicular to the scanning direction×dot pitch Ydp in a direction parallel to the scanning direction) as one unit, and thus, the CAD data is converted into raster data.

A plurality of lines can be drawn over a substrate 301 in a main scanning direction 304 without particular problems if an interval (nozzle pitch) np between a plurality of nozzles 303 provided in a head 302 and a dot pitch dp in a direction perpendicular to the main scanning direction (sub scanning direction 305) satisfy np=Mdp (M is a natural number) (the case corresponding to FIG. 3A). It is to be noted that if np=Mdp, a head major-axis direction almost matches with the sub scanning direction 305.

However, if np≠Mpd (the case corresponding to FIG. 3B), the nozzle pitch np is changed to a nozzle pitch Np by tilting the major axis of the head by an angle θ (also referred to as a head attachment angle) to the direction perpendicular to the main scanning direction (sub scanning direction 305) so that Np (Np=np×cos θ)=Mdp. The angle θ is an angle between a head major-axis direction 306 and the sub scanning direction 305. Since the major axis of the head is tilted by the angle θ, discharging positions of the plurality of nozzles provided in the head are displaced. The material droplet discharged from the x-th nozzle (x is a natural number of 2 or more) is discharged at a position displaced by (x−1)×npp×sin θ based on a position where the first nozzle discharges. In order to correct this displacement of the discharging position, the raster data is corrected; specifically, raster data in the direction parallel to the scanning direction is corrected.

If np≠Mdp, since the area of a square with a dot pitch dp on one side is regarded as one unit, the discharging position may be displaced by ±dp/2 even though the raster data is corrected in accordance with the aforementioned procedure.

For example, as an information output device for a word processor, a personal computer, or the like, a printer using an ink jet apparatus for recording information such as letters or images on paper or a film does not cause particular problems provided that the displacement of a discharging position by ±dp/2 is not perceived by human eyes. However, if minute wires and the like are formed by an ink jet apparatus in manufacturing of an electric circuit, the displacement of a discharging position by ±dp/2 may be a main cause of breaking of wires or short-circuiting. In other words, as compared to printing on paper, discharging controls including controls of a discharging position, a discharging timing, and the like are required to have very high accuracy in manufacturing of electric circuits.

Therefore, according to one aspect of the present invention, after design diagram data of an electric circuit is created using a CAD tool, the design diagram data is converted into first raster data, which is then converted into second raster data. The first raster data is a square grid regarding a dot pitch Xdp in a horizontal direction and a dot pitch Ydp in the perpendicular direction as one unit. The second raster data is a rectangular grid regarding the dot pitch Xdp in the horizontal direction and a dot pitch Ydp/V (V>1) as one unit. The value of V, which is an indicator of segmentation, can be appropriately determined by a designer. By increasing V, the raster data can be further segmented. When discharging is conducted based on thus segmented raster data, discharging control with higher accuracy can be achieved.

When the design diagram data is segmented equally in both the horizontal direction and the perpendicular direction, the number of scanning times increases consequently. In the present invention, desired wires and the like are formed without increasing the number of scanning times by segmenting the design data in the main scanning direction of the head.

In the case of segmenting raster data, it is important not to convert the design diagram data simply but to convert the design diagram data into the raster data so that an arbitrary discharging number be the same before and after the conversion. This is because it becomes difficult to form the desired wires and the like if the arbitrary discharging number is increased in accordance with the proportion of segmentation when the data is converted into segmented raster data.

Discharging control with higher accuracy can be achieved by correcting, with the use of the segmented raster data, the displacement of a discharging position caused by tilting the major axis of the head by an angle θ.

Since the design diagram data of an electric circuit is created using a CAD tool to form a wire and the like by an ink jet apparatus, design data for another layer that uses an apparatus other than the ink jet apparatus (such as a laser irradiation apparatus or a light-exposure apparatus) can be shared; therefore, a designer can easily know the whole circuit structure and wire positions. That is to say, the design diagram data which is created by a CAD tool and the design data which is obtained by converting the design diagram data in order to perform discharging by the ink jet apparatus are both prepared.

In order to increase the design efficiency, the ink jet apparatus may be provided with a computer electrically connected thereto, and a program for forming desired raster data automatically based on the design diagram data of the electric circuit obtained by a CAD tool may be created and executed using the computer. Parameters such as an angle θ between the major axis of the head and the direction perpendicular to the main scanning direction may be stored in a memory and the like in advance or may be inputted manually each time. The design diagram data of the electric circuit using a CAD tool may be created by a host computer and the host computer may be connected to the computer provided to the ink jet apparatus so that the design diagram data can be sent to the ink jet apparatus.

The present invention can be applied not only to a step of forming wires but also to other steps using an ink jet apparatus. For example, a mask is selectively formed over a material film by an ink jet apparatus using a resin material such as resist, and the material film may be selectively etched.

One aspect of the present invention disclosed in this specification is a method for manufacturing a semiconductor device, in which at least a part of material stacked layers is drawn over a substrate having an insulating surface by a droplet discharging apparatus, and the method includes: creating first circuit design diagram data for providing a first material layer over the substrate having an insulating surface by a CAD tool; converting the first circuit design diagram data into first raster data for determining a discharging position, regarding an area with a dot pitch Xdp in a horizontal direction and a dot pitch Ydp in a perpendicular direction as one unit; creating second raster data having a dot pitch Ydp/V (V>1) by segmenting the first raster data in a main scanning direction, i.e., a substrate-moving direction; thinning an arbitrary discharging number of the second raster data to create third raster data having the same arbitrary discharging number as the first raster data; determining a head tilt angle θ between a sub scanning direction and a head major-axis direction of the droplet discharging apparatus provided with a head having a plurality of nozzles; creating fourth raster data in which discharging timing of each nozzle has been corrected based on the head tilt angle θ; forming the first material layer over the substrate having an insulating surface by discharging a droplet based on the fourth raster data, in such a way that the head and the substrate are relatively moved in the main scanning direction or the sub scanning direction while maintaining the head tilt angle θ; and creating second circuit design diagram data for providing a second material layer over the first material layer by a CAD tool and forming the second material layer.

In the above structure, the head tilt angle θ is determined based on arc cos (dot pitch Xdp×nozzle number/the length of the major axis of the head).

In any of the aforementioned structures, after creating the fourth raster data, the fourth raster data is corrected based on a scanning route of the head or the substrate.

In any of the aforementioned structures, a control circuit is connected to the droplet discharging apparatus. The control circuit copies the circuit design diagram data from design database, and executes a program for automatically converting the circuit design diagram data into the fourth raster data.

In this specification, the main scanning direction indicates a direction where an object to be processed such as a substrate is to be delivered, and a direction perpendicular to the main scanning direction is called the sub scanning direction. A head having nozzles in a row has limitation on the arrangement density of nozzles in production of the head. Thus, when the major axis of the head is tilted to the sub scanning direction to conduct scanning in the main scanning direction, each nozzle can be used efficiently to shorten the process time.

In addition, the process time may be shortened by arranging nozzles in two or more rows. Furthermore, the process time may be shortened by providing a plurality of heads in one ink jet apparatus.

The head and the object to be processed may be moved back and forth relatively. For example, if they are moved back and forth relatively, the process time can be shortened to half by using one head in the following way: (1) discharging is conducted by moving the head of the ink jet apparatus relative to the object to be processed in the main scanning direction, (2) the discharging is stopped and the head is displaced by ½ of the nozzle pitch in the sub scanning direction, and (3) the head is moved in a direction opposite to the main scanning direction to restart the discharging.

In this specification, the term of "nozzle" collectively refers to a discharging port of a droplet, a liquid path connecting to the discharging port, and an element that generates energy used for droplet discharging (such as a piezo element) unless otherwise stated.

It is also possible to make the length of the major axis of the head equal to or longer than the length of the object to be processed in a longitudinal direction, for example, one side of a substrate. When the number of nozzles provided in one head increases, it becomes more difficult to homogenize the diameter d of the dot discharged from each nozzle. Moreover, when the number of nozzles increases, in the case of scanning in the main scanning direction with the major axis of the head tilted by an angle θ to the sub scanning direction, it requires hard work to create correction data over the entire nozzle region (such as correction data due to the angle θ). Therefore, the major axis of the head is preferably shorter than the length of the object to be processed in the longitudinal direction.

In addition, a region having different wettability from a surface of the object to be processed may be formed on the surface of the object to be processed prior to dripping by the ink jet apparatus. The region having different wettability means that a contact angle of a composition containing a pattern formation material is different. A region where a contact angle of the composition containing a pattern formation material is large is a region having low wettability (hereinafter this region is also referred to as a low-wettable region); on the other hand, a region where the contact angle is small is a region having high wettability (hereinafter this region is also referred to as a high-wettable region). When the contact angle is large, a liquid composition having fluidity does not spread over the region surface and is repelled so as not to wet the surface. Meanwhile, when the contact angle is small, the composition having fluidity spreads over the surface to wet the surface well. Therefore, the regions having different wettability also differ in their surface energies. The surface of the region with low wettability has low surface energy, while that of the region with high wettability has high surface energy. In the present invention, the difference in contact angles of these regions having different wettability is 30° or more, and preferably 40° or more.

These means are not just matters of design but matters invented as a result of careful examination by the inventors after forming wires by a droplet discharging apparatus, manufacturing a display device by the wires, and displaying images by the display device.

According to the present invention, discharging control with higher accuracy can be achieved by correcting with the use of segmented raster data.

DETAILED DESCRIPTION OF THE INVENTION

Embodiment modes of the present invention will be hereinafter described.

Embodiment Mode 1

Figure 4:
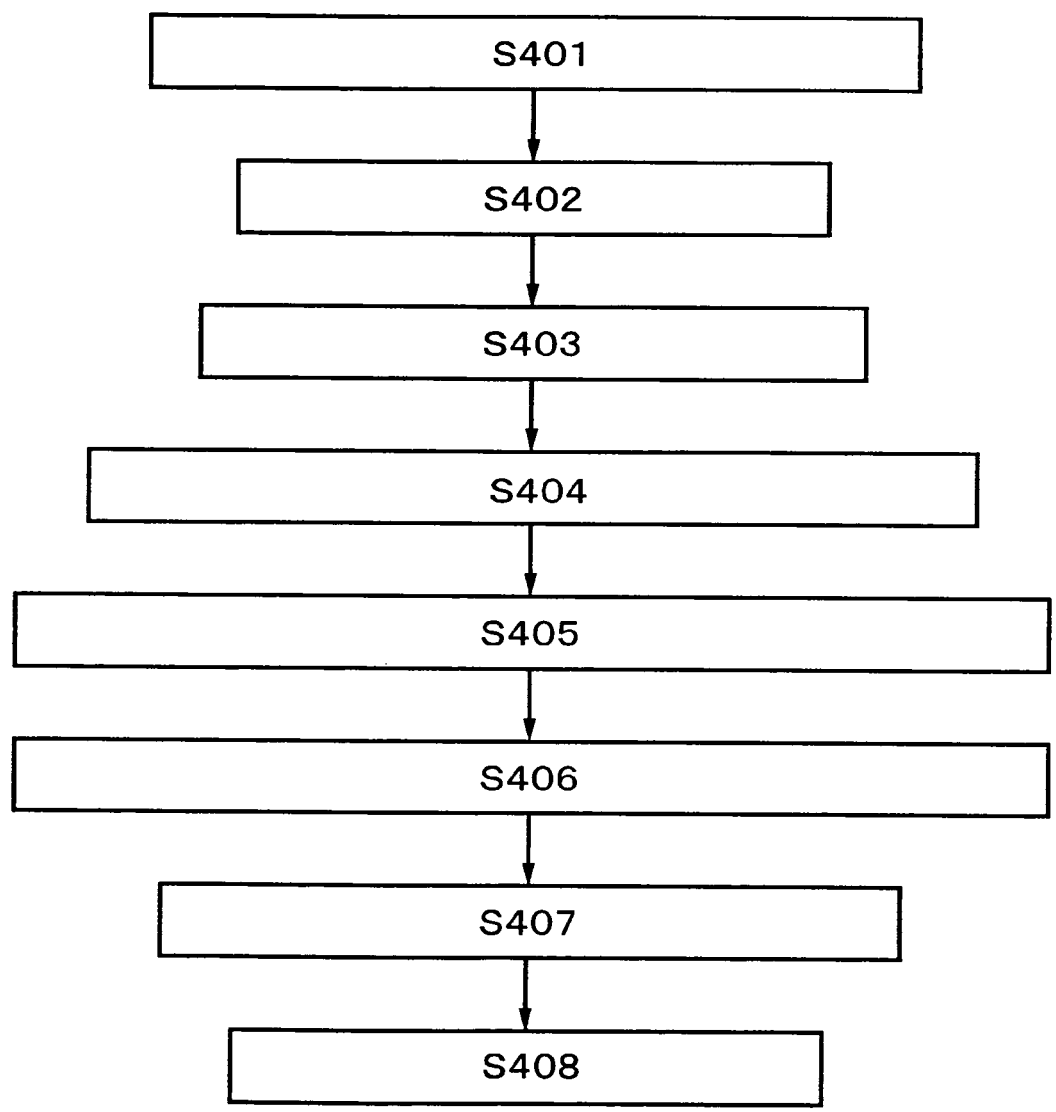
FIG. 4 is a flow chart showing steps up to droplet discharging.

A flow chart from designing to droplet discharging is shown in FIG. 4. In order to manufacture a desired semiconductor device, first, each part is designed by a computer with a CAD tool (S401). A design diagram is created for each layer (a design diagram for a light-exposure mask, a doping mask, or the like).

After completing the designs, a design diagram of a material layer to be formed by an ink jet apparatus is selected and taken out from among those design diagrams (S402). The entire semiconductor device may be formed by an ink jet apparatus if possible.

The ink jet apparatus is provided with a head having an A number of nozzles (A is an integer of 2 or more) in a row, and droplets are discharged from different nozzles by changing a relative position between the head and an object to be processed, here a substrate. In order to discharge a droplet of a material through a binarizing process or a value-multiplexing process, the ink jet apparatus converts the design diagram obtained by a CAD tool into first raster data (S403). In this conversion, the design diagram is divided into square elements, each of which is regarded as one unit, by cubic grids each having a certain distance on one side. Here, the square element as one unit has a dot pitch dp in a main scanning direction×a dot pitch dp in a sub scanning direction.

Next, in order to control the discharging with higher accuracy, the one unit is segmented into V units so as to be dp/V, whereby data conversion is carried out so as to increase the data number in the main scanning direction by V times (S404).

Then, thinning is conducted for data correction so that the arbitrary discharging number be the same before and after the segmentation into the V units (S405).

Subsequently, another data correction is made in consideration of parameters caused by the displacement of a discharging position, here a head tilt angle θ (S406).

If necessary, discharging data may be rearranged in accordance with the order of nozzles to discharge (S407). Moreover, if the head is scanned back and forth, the discharging data may be rearranged in accordance with the scanning route.

When the discharging is conducted using the data obtained in accordance with the above procedure (S408), the displacement of a discharging position can be suppressed drastically.

The ink jet apparatus may be provided with a design data automatic conversion means for automatically converting and/or correcting the aforementioned design data, typically a computer having a program that automatically converts and/or corrects the design data. By having the design data automatic conversion means, the ink jet apparatus can prepare, in a short period, data that is appropriate for the ink jet apparatus. If some kind of problem occurs in circuit designing, even portions where circuits operate properly have to be relocated. In this case, modification of the design data may consume much time. After the modification, circuit analysis and the like are carried out again, followed by repeat of layout change and circuit analysis; thus, a final design diagram is completed. When the ink jet apparatus is provided with the design data automatic conversion means, data creation is possible in a short period even if there is a drastic change in the layout.

When wires are formed by the ink jet apparatus, design diagram data of electric circuits is formed by a CAD tool; therefore, design data for another layer using an apparatus other than the ink jet apparatus (such as a laser irradiation apparatus or a light-exposure apparatus) can be shared. Thus, a designer can easily know the whole circuit structure and wire positions.

Embodiment Mode 2

Here, description is made of an example for forming a wire in the following manner: a metal film is formed over a substrate having an insulating surface by a sputtering method, a resist material is discharged by an ink jet apparatus, and the metal film is etched by using the obtained resist material layer as a mask.

First, a tungsten film is formed over a glass substrate (5 inch on a side) by a sputtering method. Then, a resist material layer is dripped over the tungsten film by an ink jet apparatus (with a nozzle pitch of 507.5 μm and an upper limitation on discharging position accuracy of 6 μm), and then the resist material layer is baked. Prior to the dripping by the ink jet apparatus, the surface of the tungsten film may be coated with a silane coupling agent represented by a chemical formula $R_n$—Si—$X_{(4-n)}$ (n=1, 2, 3). By using a fluorine-based silane coupling agent (fluoroalkylsilane (FAS)) having a fluoroalkyl group in R as a typical example of a silane coupling agent, the wettability of the tungsten film can be lowered further. R in FAS has a structure represented by $(CF_3)(CF_2)_x(CH_2)_y$ (x is an integer of 0 or more and 10 or less, and y is an integer of 0 or more and 4 or less). If a plurality of Rs or Xs are bonded to Si, all the Rs or Xs may be the same or different. As typical FAS, fluoroalkylsilane (hereinafter also referred to as FAS) such as the following is given:
heptadefluorotetrahydrodecyltriethoxysilane,
heptadecafluorotetrahydrodecyltrichlorosilane,
tridecafluorotetrahydrooctyltrichlorosilane, or trifluoropropyltrimethoxysilane.

Figure 1A:
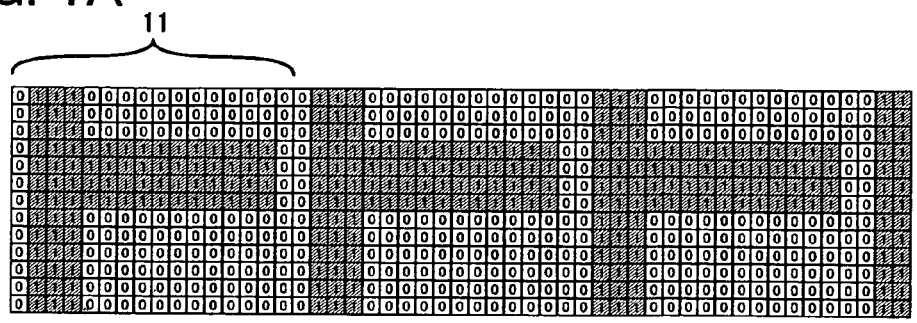
FIGS. 1A and 1B show raster data created in accordance with the present invention.

FIG. 1A shows raster data in which the design data obtained by a CAD tool is divided into units each with a size of 32.25 μm×32.25 μm. Black parts in FIG. 1A show discharging positions. The divided unit has a length of 32.25 μm on one side, which is a value based on a dot pitch of the ink jet apparatus to be used. A region 11 where drawing is conducted by one nozzle corresponds to a region where 16 dots are dripped, i.e., has a width of 32.25 μm×16=500 μm.

Figure 1B:
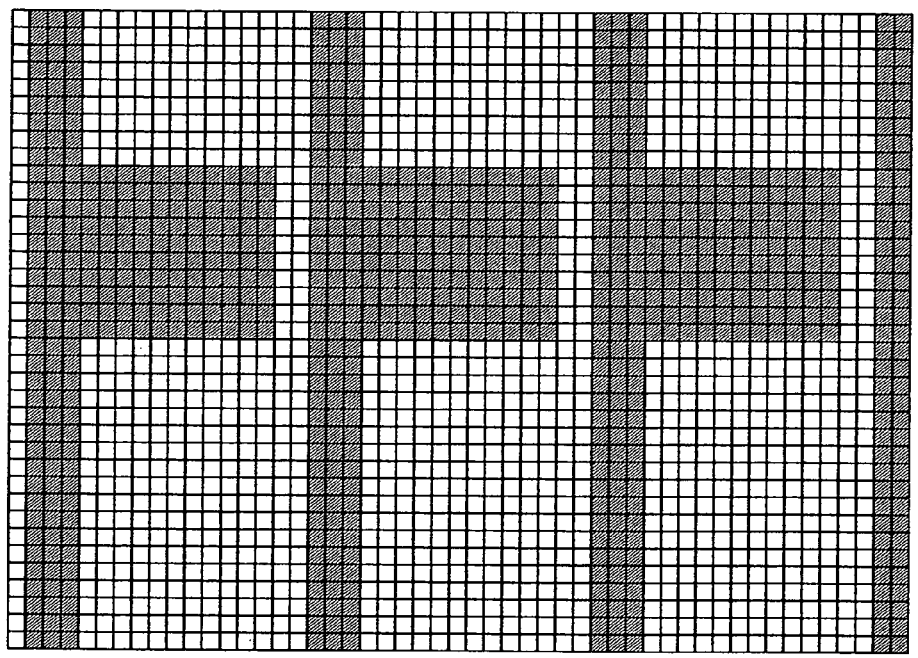

Subsequently, the raster data in the main scanning direction is divided again to make one side in the main scanning direction have a length of 6 μm. In other words, stretch raster data, which is extended by 5.375 times, is formed. The raster data at this stage is shown in FIG. 1B.

Figure 2A:
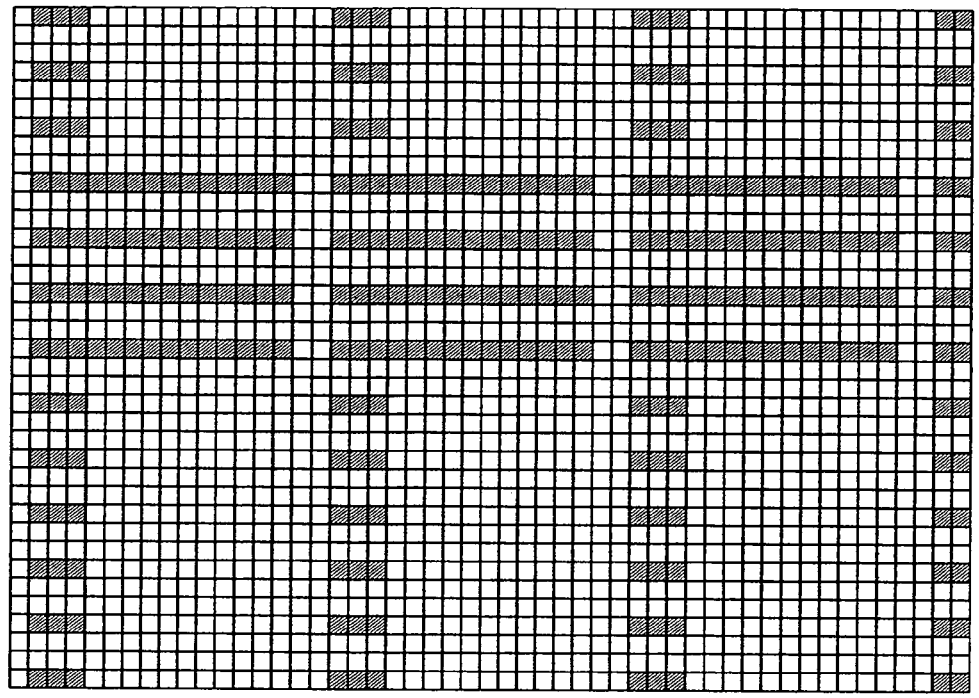
FIGS. 2A and 2B show raster data created in accordance with the present invention.

Next, thinning is carried out so that the arbitrary discharging number is equal to that in FIG. 1A. The raster data at this stage is shown in FIG. 2A.

Figure 2B:
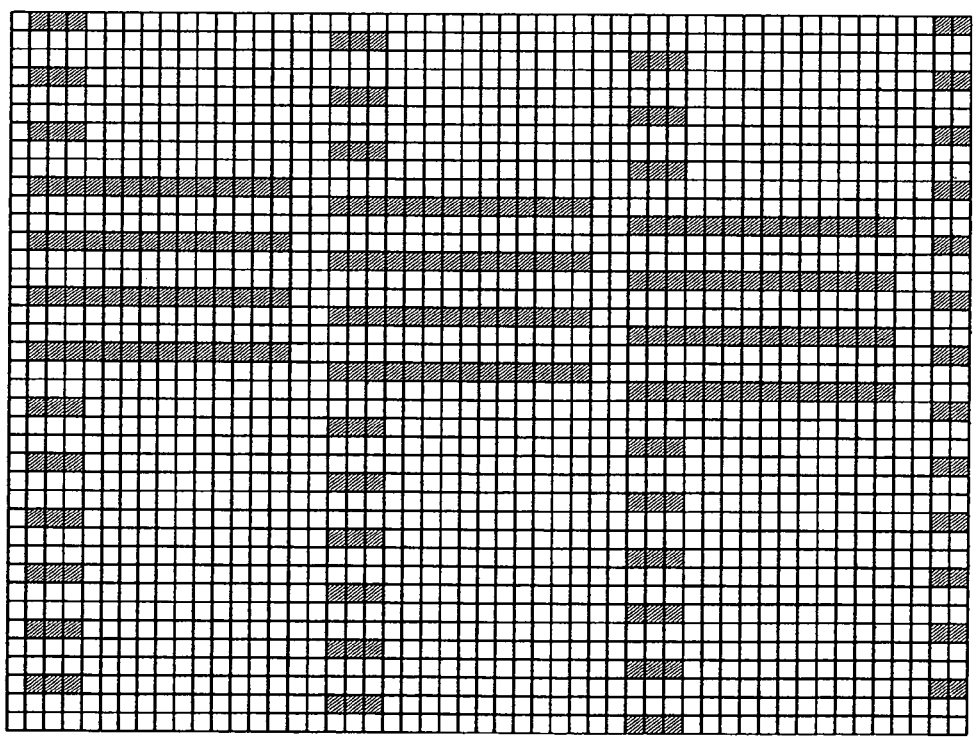
Figure 3A:
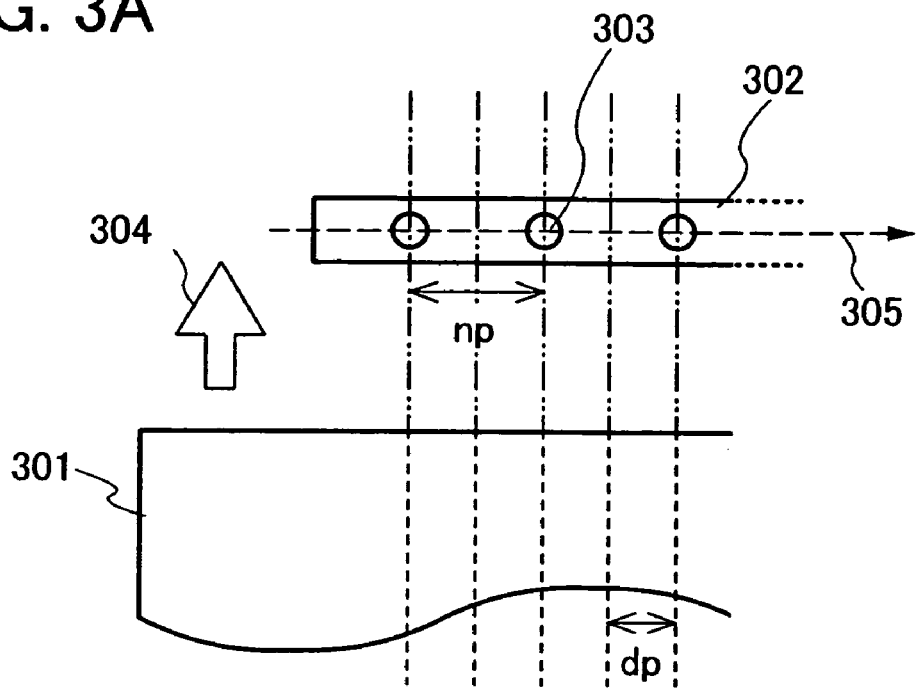
FIGS. 3A and 3B are top views showing a relation among a head, a nozzle, a dot pitch, and an angle at which a major axis of the head is tilted.
Figure 3B:
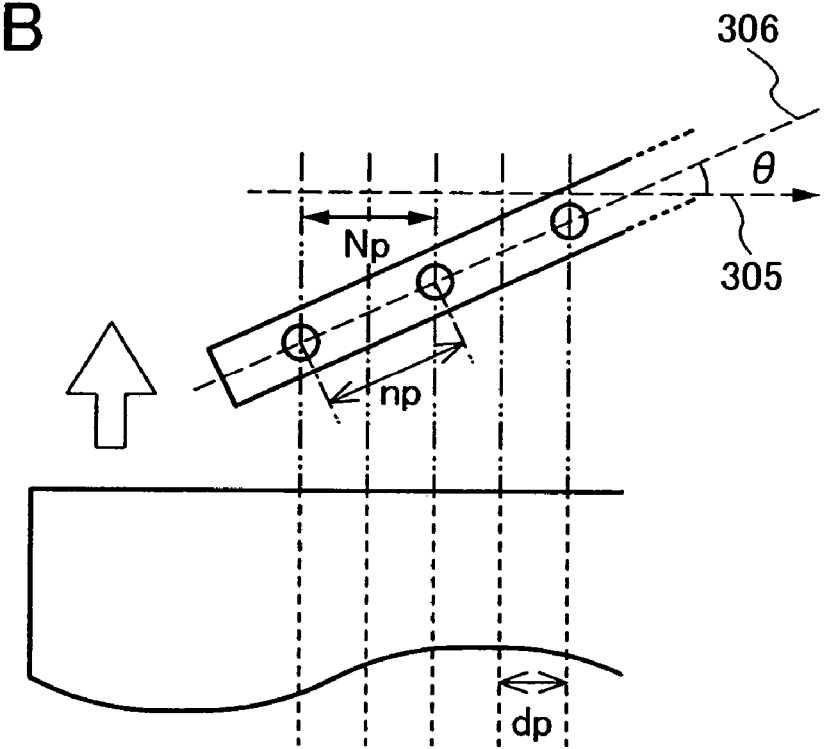

Subsequently, the raster data where correction is made on the angle θ at which the major axis of the head is tilted to a direction perpendicular to the main scanning direction is created. The raster data at this stage is shown in FIG. 2B. The nozzle pitch is 507.5 μm and a region where drawing is conducted by one nozzle has a width of 500 μm. Therefore, the angle θ is arc cos (500/507.5)=9.8°. Thus, the displacement in the main scanning direction per nozzle can be delayed by 86.9/6=14.4 dots. Since there is no displacement after the decimal point, it is rounded so that the second nozzle may be delayed by 14 dots with respect to the first nozzle, and the third nozzle may be delayed by 29 dots with respect to the first nozzle.

Figure 5:
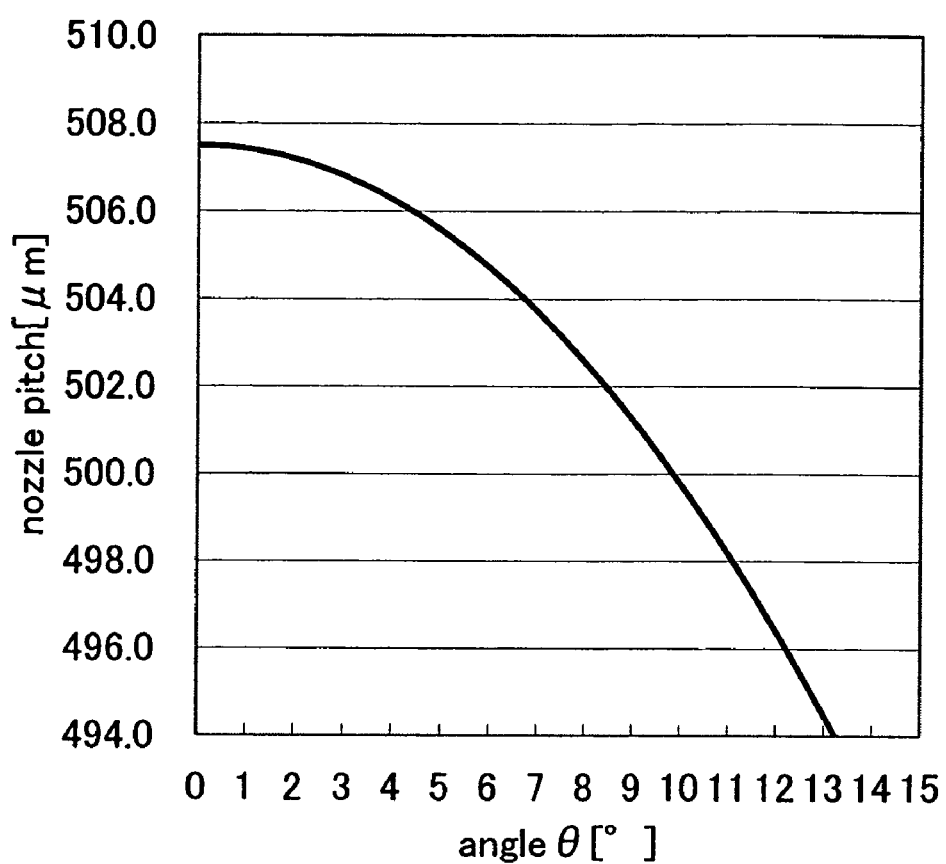
FIG. 5 is a graph showing a nozzle pitch and an angle θ at which a major axis of a head is tilted.

Further, FIG. 5 is a graph showing a relation between the angle θ and the nozzle pitch in the direction perpendicular to the main scanning direction. If a region where drawing is conducted by one nozzle is set to have a certain width, an angle in accordance with the point where a horizontal axis corresponding to the certain width intersects with a solid line in the graph is preferably set to be the angle θ.

Figure 6:
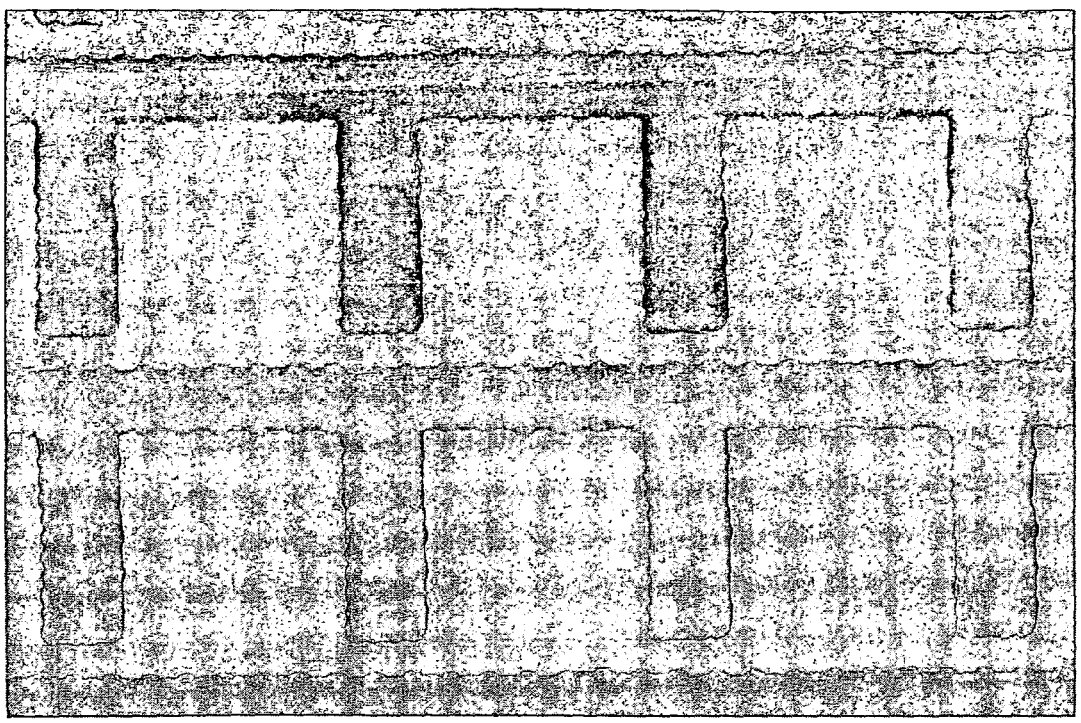
FIG. 6 is a photograph viewed from a top plane.

FIG. 6 is a top view of a mask observed by an optical microscope, which was formed by actually conducting discharging with the use of the above raster data and then baking. The number of nozzles provided in the head (manufactured by Spectra Inc.) is 128; however, 64 nozzles of them were used. The frequency of discharging is 19 kHz. The mask was formed by scanning 100 times in the main scanning direction.

A portion with narrow width in FIG. 6 has the width corresponding to three dots, i.e., about 18 μm. A portion with wide width has the width corresponding to four dots, i.e., about 24 μm. Even if the scanning of the head is repeated while displacing the head in a direction perpendicular to the main scanning direction, the displacement of a mask shape in the direction perpendicular to the main scanning direction cannot be confirmed. In this way, according to the present invention, a fine mask shape with a dot pitch (here 32.25 μm) or less can be obtained accurately.

In order to shorten the process time, 128 nozzles may be used to make the process time half. Here, the head is scanned in one direction; however, if the head is scanned back and forth, the process time can be shortened further.

Embodiment Mode 3

In accordance with the present invention, a semiconductor device or a display device is manufactured in such a way that at least one of constituents required for forming the semiconductor device, the display device, or the like, such as a conductive layer for forming a wiring layer or an electrode or a mask layer for forming a desired pattern is formed by a method capable of selectively forming in a desired shape. In the present invention, the constituents (also called patterns) are a conductive layer such as a wiring layer, a gate electrode layer, a source electrode layer, or a drain electrode layer, a semiconductor layer, a mask layer, an insulating layer, and the like and include all the constituents formed to have a predetermined shape. As the method capable of selectively forming an object in a desired pattern, a droplet discharging setting) method (also called an ink jet method depending on its system) capable of forming a conductive layer, an insulating layer, or the like in a predetermined pattern by selectively discharging (jetting) a droplet of a composition which is mixed for a particular purpose is used.

In this embodiment mode, a method of forming in a desired pattern by discharging (jetting) a droplet of a composition including a constituent-forming material, which is a fluid, is used. In a region where the constituent is to be formed, the droplet including the constituent-forming material is discharged, baked, dried etc., to be fixed, thereby forming the constituent in the desired pattern.

Figure 7:
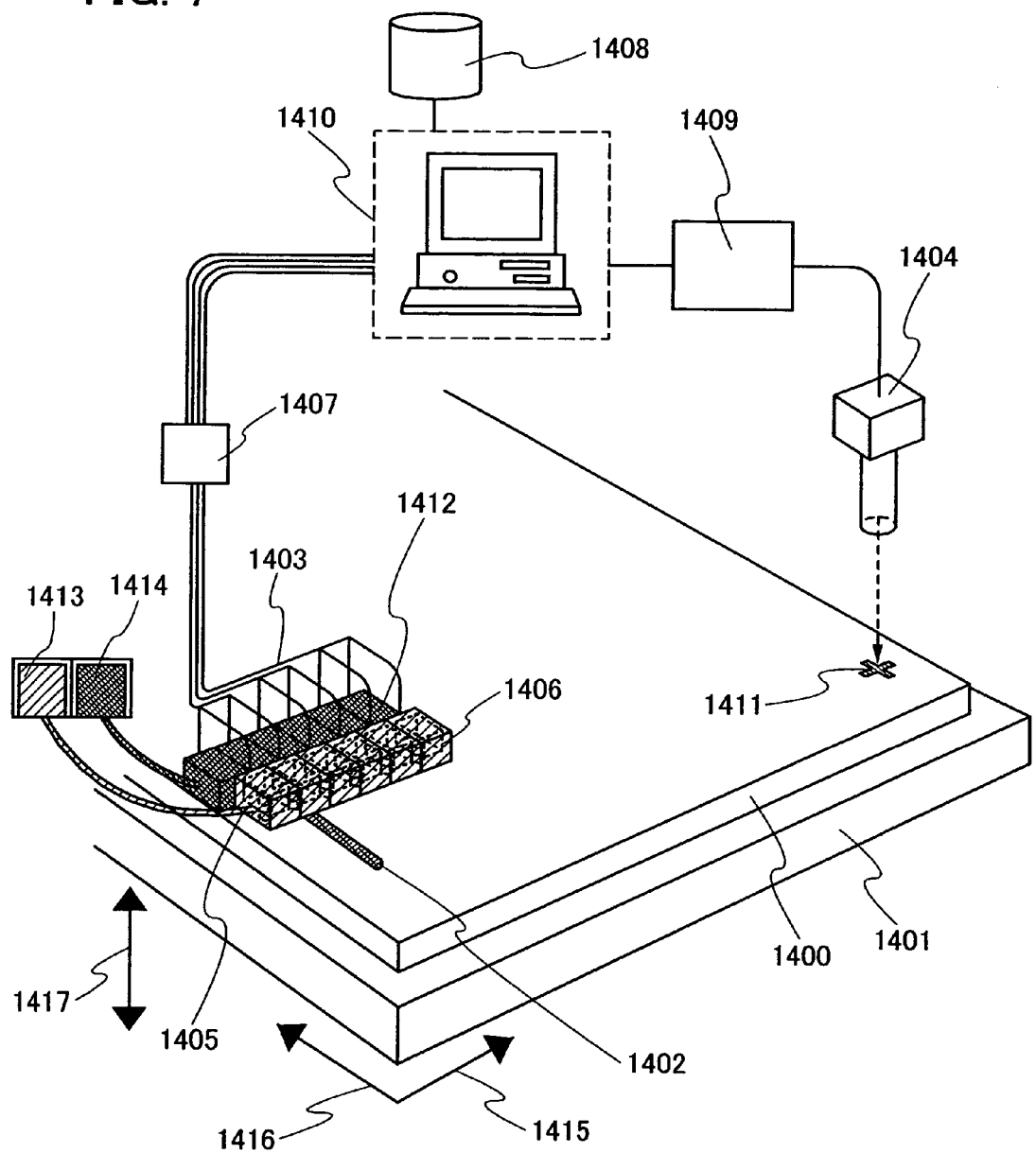
FIG. 7 is a perspective view showing a structure of a droplet discharging apparatus.

FIG. 7 shows a mode of a droplet discharging apparatus used in a droplet discharging method. Each of heads 1405 and 1412 of a droplet discharging means 1403 is connected to a controlling means 1407, which is controlled by a computer 1410. Circuit design diagrams and the like are designed by a host computer 1408 connected to the computer 1410 using CAD software, and the circuit design diagrams are stored in the host computer 1408.

In this embodiment mode, as shown in Embodiment Mode 1 or 2, the design diagrams are created by the host computer using CAD software, a design diagram for a material to be formed by a droplet discharging method is selected, segmented raster data is formed from the design diagram by the computer 1410, and the material is discharged based on the corrected data.

In addition to the design by a CAD tool, a program that automatically creates desired raster data may be created and executed by the host computer 1408. In this case, the obtained raster data is transferred to the computer 1410 connected electrically to the droplet discharging apparatus and the data is held therein. Then, discharging may be conducted using the data by the droplet discharging apparatus. If the desired raster data is created automatically by the host computer 1408, the computer 1410 does not need to have high performance. Therefore, not only a computer but also a control circuit having a storage circuit that can hold the obtained raster data may be used, which can achieve size reduction of the whole droplet discharging apparatus.

The computer 1410 and the host computer 1408 are not necessarily connected to each other directly. The circuit design diagram created by the host computer 1408 may be stored in a storage medium and the storage medium may be read in by the computer 1410.

The drawing may be conducted at a timing, for example, based on a marker 1411 formed over the substrate 1400. Alternatively, a reference point may be fixed based on the rim of the substrate 1400. This is detected by an imaging means 1404 and converted into a digital signal by an image processing means 1409. Then, the digital signal is recognized by the computer 1410 to generate a control signal, and the control signal is sent to the controlling means 1407. As the imaging means 1404, an image sensor using a charge coupled device (CCD) or a complementary metal oxide semiconductor (CMOS), or the like can be used. Needless to say, the information (raster data) on a pattern 1402 to be formed over the substrate 1400 is created by the computer 1410. Based on this information, the control signal is sent to the controlling means 1407, so that each of the heads 1405 and 1412 of the droplet discharging means 1403 can be separately controlled. When discharging is conducted using the obtained raster data, the displacement of a discharging position can be suppressed drastically. The material to be discharged is supplied to each of the heads 1405 and 1412 through pipes from a material supply source 1413 and a material supply source 1414.

The inside of the head 1405 has a space filled with a liquid material as indicated by a dotted line 1406 and a nozzle serving as a discharging port. Although not shown, the head 1412 has an internal structure which is similar to that of the head 1405. When the head 1405 and the head 1412 have nozzles with different sizes, drawing can be carried out with different materials in different widths at the same time. If a conductive material, an organic material, an inorganic material, and the like can be discharged from one head to carry out drawing in a wide region such as an interlayer film, the same material can be discharged at the same time from a plurality of nozzles in order to improve the throughput. In the case of using a large substrate of the sixth generation: 1500×1800 mm, the seventh generation: 1870×2200 mm, the eighth generation: 2160×2400 mm, or the like, the head 1405 and the head 1412 can be scanned freely in an arrow direction over the substrate, and a region where the drawing is carried out can be set freely so that a plurality of the same patterns are drawn over one substrate.

The substrate 1400 is fixed onto the stage 1401, which is moved in an arrow direction (main scanning direction) 1415 in the figure or an arrow direction (sub scanning direction) 1416 in the figure to draw the pattern 1402. The stage 1401 can also be moved up and down, the direction of which is shown by an arrow 1417 in the figure.

In the case of forming a conductive layer by a droplet discharging method, a composition including a conductive material processed into a particle form is discharged, and fused or welded and joined by baking to solidify the composition. In contrast with many of conductive layers (or insulating layers) formed by a sputtering method or the like that have columnar structures, many of conductive layers (or insulating layers) formed by discharging a composition including a conductive material and baking the composition exhibit a poly-crystalline state having a number of grain boundaries.

This embodiment mode can be freely combined with Embodiment Mode 1 or 2.

The present invention having the aforementioned structure will be described in more detail in embodiments hereinafter shown.

Embodiment 1

Embodiment 1 will hereinafter describe a method for manufacturing a display device having an inverted staggered thin film transistor according to the present invention.

As a substrate 100, a glass substrate made of barium borosilicate glass, aluminoborosilicate glass, or the like; a quartz substrate; a metal substrate; or a plastic substrate having heat resistance that can withstand process temperature of the present manufacturing steps is used. A surface of the substrate 100 may be polished by a CMP method or the like so as to be flattened. An insulating layer 101 may be formed over the substrate 100. The insulating layer 101 is formed to have a single-layer structure or a multilayer structure using an oxide material containing silicon or a nitride material containing silicon by a known method such as a CVD method, a plasma CVD method, a sputtering method, or a spin coating method. This insulating layer is not necessarily formed; however, this insulating layer has an advantageous effect of preventing the diffusion of contamination substances and the like contained in the substrate 100.

Next, a liquid composition containing a conductive material is discharged over the insulating layer 101 using a droplet discharging apparatus. When the discharging is conducted based on data obtained by the method shown in any of Embodiment Modes 1 to 3, the displacement of a discharging position can be suppressed, which can prevent wires from breaking and so on. Since the liquid composition containing a conductive material is in a liquid state, the shape of the composition is largely affected by a surface condition of a region where the composition is to be formed. Therefore, the surface is preferably subjected to a treatment for changing the wettability of the surface prior to the droplet discharging.

Next, the composition is baked, dried, and so on to be solidified, thereby forming a gate electrode layer 107 and a gate electrode layer 108.

The gate electrode layer 107 and the gate electrode layer 108 may be formed with an element selected from Ag, Au, Ni, Pt, Pd, Ir, Rh, Ta, W, Ti, Mo, Al, and Cu or an alloy or compound material containing the element as its main component. A mixture containing the above element may also be used. Not only a single-layer structure but also a multilayer structure including two or more layers is also applicable.

If the gate electrode layer 107 and the gate electrode layer 108 need to be patterned, a mask may be formed and then dry etching or wet etching may be carried out. The electrode layers can be etched into a tapered shape using an ICP (Inductively Coupled Plasma) etching method by appropriately changing an etching condition (electric energy applied to a coil-shaped electrode, electric energy applied to an electrode on a substrate side, electrode temperature on a substrate side, and the like). As the etching gas, chlorine-based gas typified by $Cl_2$, $BCl_3$, $SiCl_4$, or $CCl_4$; fluorine-based gas typified by $CF_4$, $SF_6$, or $NF_3$; or $O_2$ can be appropriately used.

Subsequently, a gate insulating layer 106 is formed over the gate electrode layer 107 and the gate electrode layer 108. The gate insulating layer 106 may be formed with a known material such as an oxide material of silicon or a nitride material of silicon to have a single-layer structure or a multilayer structure. In this embodiment, a two-layer structure of a silicon nitride film and a silicon oxide film is used. In addition to these, a single layer of a silicon oxynitride film or a multilayer including three or more layers may be used. It is preferable to use a silicon nitride film having dense film quality. In the case of using silver, copper, or the like for the conductive layer formed by a droplet discharging method, the provision of a silicon nitride film or an NiB film as a barrier film thereover provides advantageous effects of preventing the diffusion of impurities and flattening the surface. In order to form a dense insulating film with little gate leak current at low film-forming temperature, it is preferable that reaction gas contain a noble gas element such as argon so that the noble gas element is mixed in an insulating film to be formed.

Next, a semiconductor layer 109 and a semiconductor layer 110 are formed over the gate insulating layer 106.

The semiconductor layer can be formed with an amorphous semiconductor (hereinafter also called "AS") which is manufactured by a gas phase growth method or a sputtering method using a semiconductor material gas typified by silane or germane; a polycrystalline semiconductor which is obtained by crystallizing the amorphous semiconductor with light energy or thermal energy; a semiamorphous semiconductor (also called microcrystalline semiconductor, and hereinafter also referred to as "SAS"); or the like. The semiconductor layer can be formed by a known means (such as a sputtering method, an LPCVD method, or a plasma CVD method).

If the semiconductor layer is formed by a crystalline semiconductor layer, the crystalline semiconductor layer may be formed by a known method (such as a laser crystallization method, a thermal crystallization method, or a thermal crystallization method using an element for promoting crystallization such as nickel). The microcrystalline semiconductor, which is SAS, may be irradiated with laser to be crystallized so that the crystallinity is enhanced. In the case where the element for promoting crystallization is not introduced, the amorphous semiconductor film is heated at 500° C. for an hour in a nitrogen atmosphere prior to laser irradiation so that the hydrogen concentration of the amorphous semiconductor film is decreased to $1 \times 10^{20}$ atoms/$cm^3$ or less. This is because an amorphous semiconductor film containing too much hydrogen would be broken by laser irradiation.

In order to introduce the metal element to the amorphous semiconductor layer, any method may be used as long as the metal element can exist on the surface of or inside the amorphous semiconductor layer. For example, a sputtering method, a CVD method, a plasma treatment method (including a plasma CVD method), an adsorption method, or a method of applying a solution of metal salt can be used. Among these methods, a method using a solution is simple and has an advantage that the concentration of a metal element can be easily adjusted. Moreover, it is desirable that an oxide film be formed by UV irradiation in an oxygen atmosphere, a thermal oxidation method, a treatment by ozone water containing hydroxy radicals or hydrogen peroxide, or the like in order to improve the wettability of the surface of the amorphous semiconductor layer and to spread a water solution all over the surface of the amorphous semiconductor layer.

In order to crystallize the amorphous semiconductor layer, a thermal treatment may be combined with crystallization by a laser irradiation, or one of a thermal treatment and laser irradiation may be carried out multiple times.

Moreover, the crystalline semiconductor layer may be directly formed over the substrate by a linear plasma method. Furthermore, the crystalline semiconductor layer may be selectively formed over the substrate by a linear plasma method.

The semiconductor layer may be formed with an organic semiconductor material by a printing method, a spraying method, a spin coating method, a droplet discharging method, or the like. In this case, since the above etching step is not necessary, the number of steps can be reduced. As the organic semiconductor, a low-molecular material, a high-molecular material, or the like can be used. In addition to these, an organic dye, a conductive high-molecular material, or the like can also be used. As the organic semiconductor material used in the present invention, a $\pi$ electron conjugated high-molecular material of which skeleton includes a conjugated double bond is desirable. Typically, a soluble high-molecular material such as polythiophene, polyfluorene, poly(3-alkylthiophene), a polythiophene derivative, or pentacene can be used.

In addition, there is a material which can be used as the organic semiconductor material in the present invention. In this case, the semiconductor layer can be formed by forming a soluble precursor of the material and then performing a process thereon. The organic semiconductor material through a precursor includes polythienylenevinylene, poly(2,5-thienylenevinylene), polyacetylene, polyacetylene derivatives, polyallylenevinylene, and the like.

The precursor is changed into the organic semiconductor not only by performing a thermal treatment but also by adding a reaction catalyst such as a hydrogen chloride gas. Moreover, as a typical solvent for dissolving the soluble organic semiconductor material, toluene, xylene, chlorobenzene, dichlorobenzene, anisole, chloroform, dichloromethane, γbutyllactone, butylcellosolve, cyclohexane, N-methyl-2-pyrrolidone (NMP), cyclohexanone, 2-butanon, dioxane, dimethylformamide (DMF), tetrahydrofuran (THF), and the like can be applied.

Next, semiconductor layers 111 and 112 having n-type or p-type conductivity are formed over the semiconductor layer 109 and the semiconductor layer 110. In this embodiment, semiconductor layers having n-type conductivity containing phosphorus (P), which is an impurity element imparting n-type conductivity, are formed over the semiconductor layers. The semiconductor layers having n-type conductivity function as a source region and a drain region. The semiconductor layers having n-type or p-type conductivity may be formed as necessary. Moreover, an NMOS structure of an n-channel TFT can be manufactured by forming a semiconductor layer having n-type conductivity, a PMOS structure of a p-channel TFT can be manufactured by forming a semiconductor layer having p-type conductivity, and a CMOS structure of an n-channel TFT and a p-channel TFT can be manufactured. In order to give conductivity, an element imparting conductivity may be added to the semiconductor layer by doping to form an impurity region in the semiconductor layer so that an n-channel TFT and a p-channel TFT can be formed.

Figure 8A:
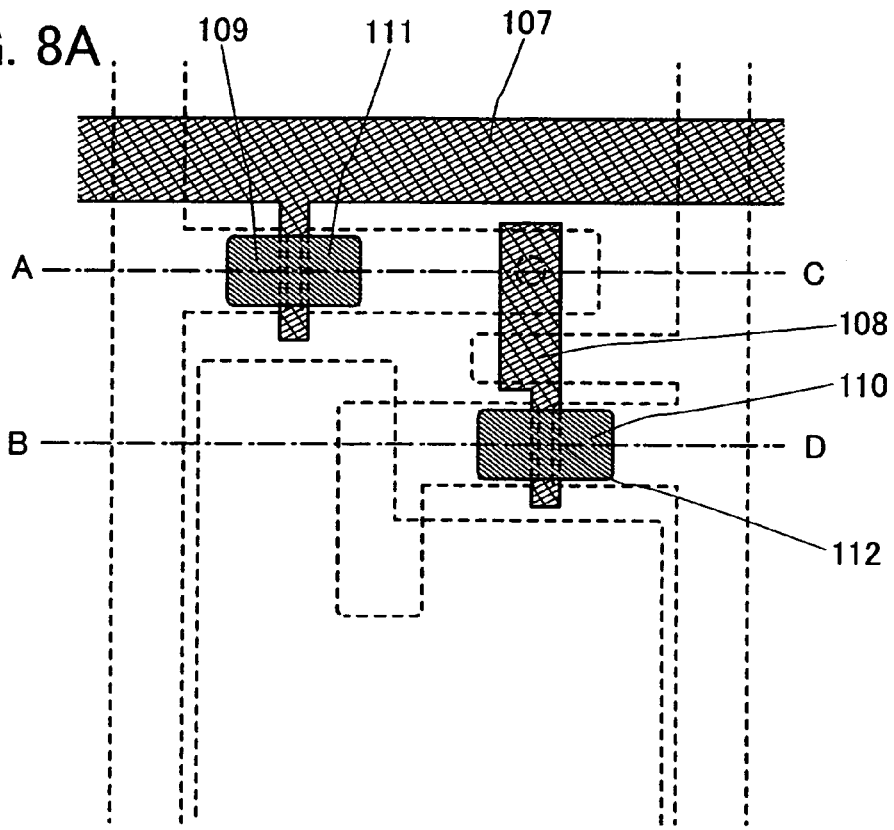
FIG. 8A is a top view and FIGS. 8B and 8C are cross-sectional views, all showing a method for manufacturing a display device of the present invention.
Figure 8B:
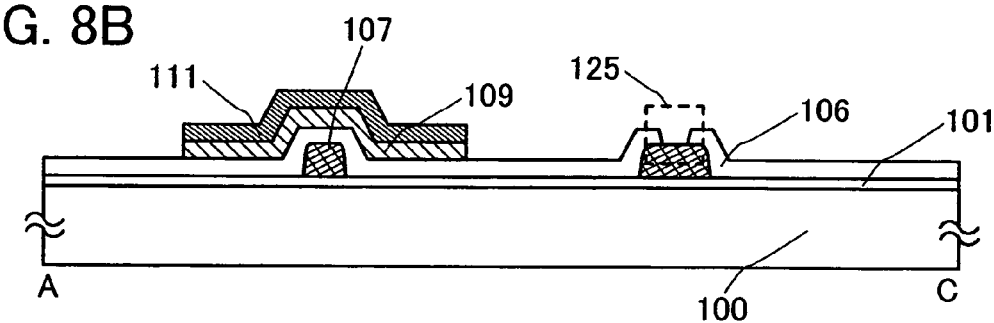
Figure 8C:
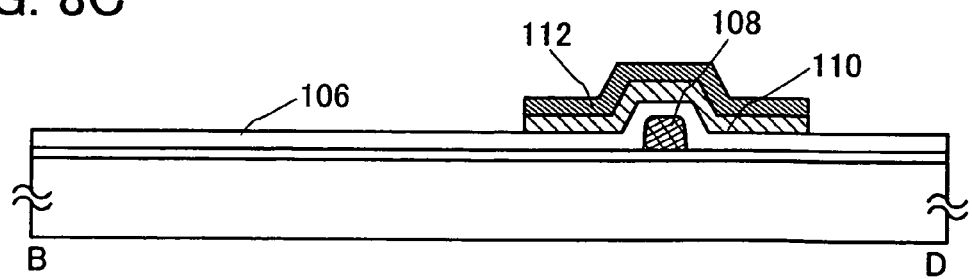

Subsequently, a mask is formed with an insulator such as resist or polyimide by a droplet discharging method. A through hole 125 is formed in a part of the gate insulating layer 106 by etching with the use of the mask, thereby exposing a part of the gate electrode layer 108 provided under the gate insulating layer 106 (see FIG. 8B). A top view at this stage corresponds to FIG. 8A. FIG. 8A is a top view showing a part of a pixel portion of a display device, FIG. 8B is a cross-sectional view along a line A-C in FIG. 8A, and FIG. 8C is a cross-sectional view along a line B-D in FIG. 8A. Either plasma etching (dry etching) or wet etching may be employed to etch the gate insulating layer 106; however, plasma etching is suitable to process a large substrate. As the etching gas, fluorine-based gas or chlorine-based gas such as $CF_4$, $NF_3$, $Cl_2$, or $BCl_3$ is used. An inert gas such as He or Ar may be added to the etching gas appropriately. When etching process of atmospheric electric discharge is applied, local electric discharging process is also possible, which can omit the step of forming the mask layer over the entire surface of the substrate.

As shown in Embodiment Mode 2, a mask for the patterning can be formed by selectively discharging a composition using a droplet discharging apparatus. As a material for the mask, a resin material such as an epoxy resin, a phenol resin, a novolac resin, an acrylic resin, a melamine resin, or a urethane resin is used. Moreover, the mask is formed by a droplet discharging method using an organic material such as benzocyclobutene, parylene, arylene ether fluoride, or polyimide having a transmitting property; a compound material formed by polymerization such as siloxane-based polymer; a composition material containing water-soluble homopolymer and water-soluble copolymer; or the like. Alternatively, a commercial resist material including photosensitizer may be used. For example, a novolac resin and a naphthoquinonediazide compound that is a photosensitizer, which are typical positive type resists; a base resin, diphenylsilanediol, and an acid generation agent, which are negative type resists; or the like may be used. In using any material, the surface tension and the viscosity are appropriately adjusted by adjusting the concentration of a solvent or by adding a surface-active agent or the like. When the mask is formed by a droplet discharging apparatus, the patterning step can be simplified and moreover the material can be saved.

Next, a liquid composition containing a conductive material is discharged over the n-type semiconductor layer 111 and the n-type semiconductor layer 112 by a droplet discharging apparatus 118a, a droplet discharging apparatus 118b, a droplet discharging apparatus 118c, and a droplet discharging apparatus 118d. The composition is dried and/or baked so as to be solidified, thereby forming a source or drain electrode layer 113, a source or drain electrode layer 114, a source or drain electrode layer 115, and a source or drain electrode layer 116.

Figure 9A:
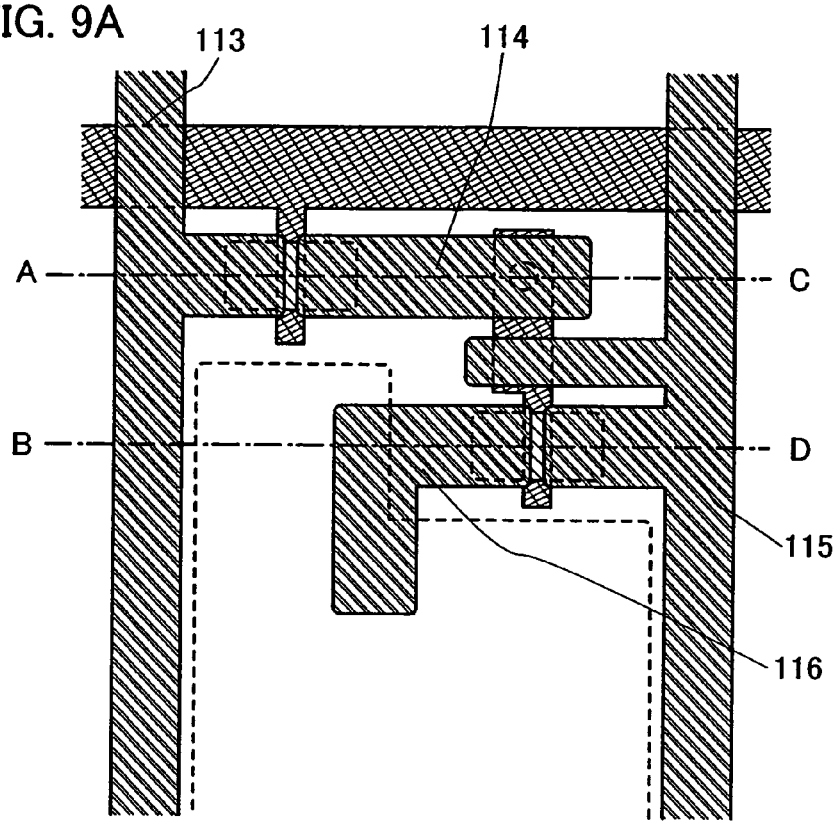
FIG. 9A is a top view and FIGS. 9B and 9C are cross-sectional views, all showing a method for manufacturing a display device of the present invention.
Figure 9B:
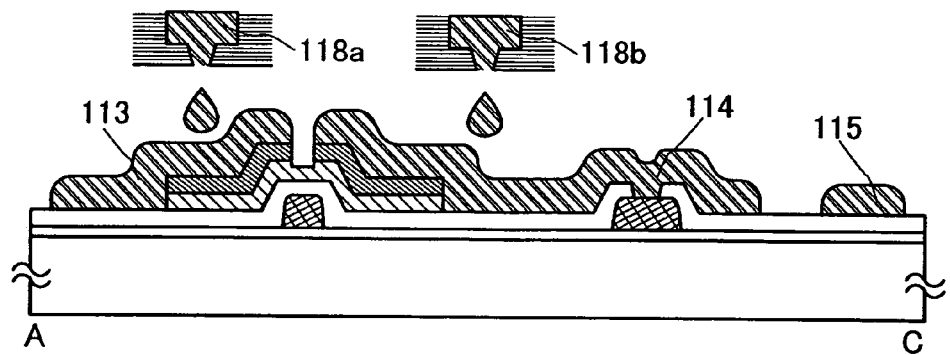
Figure 9C:
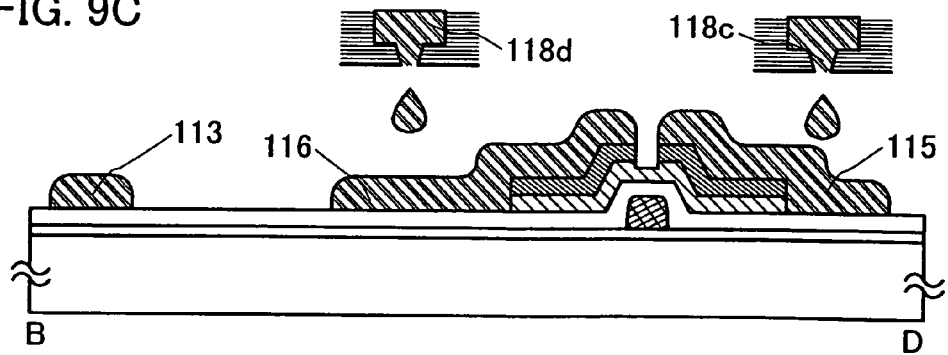

The source or drain electrode layer 113 also functions as a source wiring layer, and the source or drain electrode layer 115 also functions as a power source line. After forming the source or drain electrode layer 113, the source or drain electrode layer 114, the source or drain electrode layer 115, and the source or drain electrode layer 116, the semiconductor layer 109, the semiconductor layer 110, the n-type semiconductor layer 111, and the n-type semiconductor layer 112 are selectively etched. FIG. 9A and FIGS. 9B and 9C respectively correspond to a top view and cross-sectional views at this stage.

In the steps of forming the source or drain electrode layer 113, the source or drain electrode layer 114, the source or drain electrode layer 115, and the source or drain electrode layer 116, they can be formed at discharging timings based on the raster data obtained in a similar manner to that when the aforementioned gate electrode layer 107 and gate electrode layer 108 are formed. Since the displacement of a discharging position can be suppressed by a manufacturing method of the present invention that uses segmented raster data and a droplet discharging apparatus, the distance between the source electrode and the drain electrode can be kept constant accurately.

As a conductive material for forming the source or drain electrode layer 113, the source or drain electrode layer 114, the source or drain electrode layer 115, and the source or drain electrode layer 116, a composition containing a particle of a metal selected from Ag (silver), Au (gold), Cu (copper), W (tungsten), Al (aluminum), and the like as its main component can be used. Moreover, indium tin oxide (ITO) having a light-transmitting property, ITSO including indium tin oxide and silicon oxide, organic indium, organic tin, zinc oxide, titanium nitride, and the like may be combined.

In the through hole 125 formed in the gate insulating layer 106, the source or drain electrode layer 114 is electrically connected to the gate electrode layer 108. A part of the source or drain electrode layer forms a capacitor element.

Figure 10A:
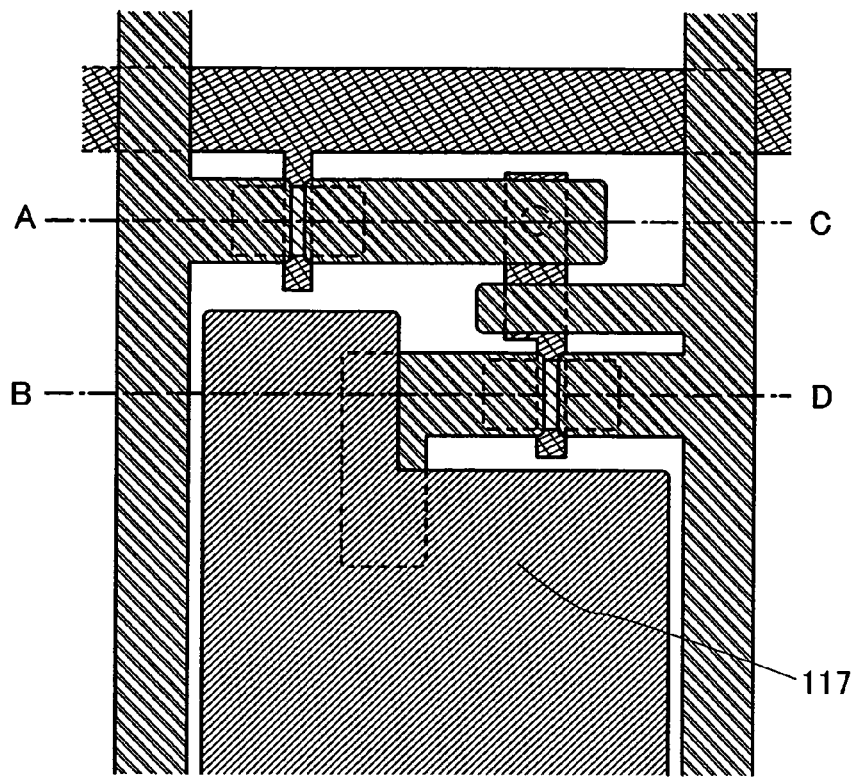
FIG. 10A is a top view and FIGS. 10B and 10C are cross-sectional views, all showing a method for manufacturing a display device of the present invention.
Figure 10B:
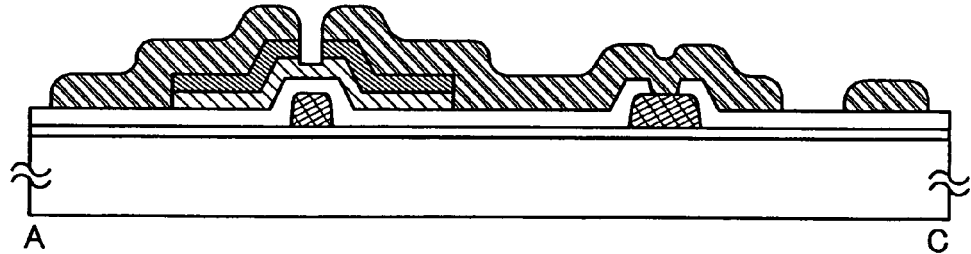
Figure 10C:
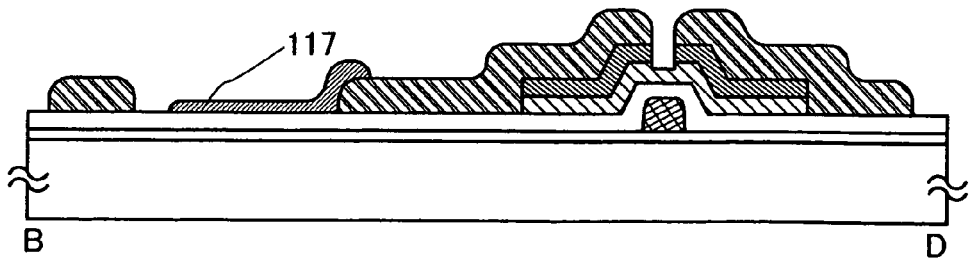

Subsequently, a composition containing a conductive material is discharged selectively over the gate insulating layer 106, thereby forming a first electrode layer 117 (see FIG. 10C). FIG. 10A and FIGS. 10B and 10C respectively correspond to a top view and cross-sectional views at this stage. If the first electrode layer 117 is formed by discharging a liquid composition containing a conductive material, a rough surface may be formed on the gate insulating layer 106 when forming the first electrode layer 117 so that the wettability is controlled. If light is emitted from the substrate 100 side, the first electrode layer 117 may be formed by forming a predetermined pattern of a composition containing indium tin oxide (ITO), indium tin oxide containing silicon oxide (ITSO), indium zinc oxide (IZO) containing zinc oxide (ZnO), zinc oxide (ZnO), gallium (Ga)-doped ZnO, tin oxide ($SnO_2$), or the like and baking the composition.

Moreover, the first electrode layer 117 is preferably formed with indium tin oxide (ITO), indium tin oxide containing silicon oxide (ITSO), zinc oxide (ZnO), or the like by a sputtering method. It is more preferable to use indium tin oxide containing silicon oxide by a sputtering method using a target in which ITO contains 2 to 10 wt % of silicon oxide. Besides those, a conductive material such as gallium (Ga)-doped ZnO, or a conductive oxide material such as indium zinc oxide (IZO) in which indium oxide containing silicon oxide is mixed with 2 to 20 wt % of zinc oxide (ZnO) may be used. After forming the first electrode layer 117 by a sputtering method, a mask layer may be formed by a droplet discharging method and etched into a desired pattern. In this embodiment, the first electrode layer 117 is formed with a light-transmitting conductive material by a droplet discharging method; specifically, indium tin oxide or ITSO formed by ITO and silicon oxide is used.

The first electrode layer 117 can be selectively formed over the gate insulating layer 106 prior to the formation of the source or drain electrode layer 116. When the first electrode layer 117 is formed before the source or drain electrode layer 116, the first electrode layer 117 can be formed in a flat region; thus, the coverage is favorable and a polishing treatment by CMP or the like can be sufficiently carried out. Therefore, the first electrode layer 117 can be formed with favorable flatness.

Moreover, an insulating layer serving as an interlayer insulating layer may be formed over the source or drain electrode layer 116 and may be electrically connected to the first electrode layer 117 by a wiring layer. In this case, a substance with lower wettability than the insulating layer can be formed over the source or drain electrode layer 116 instead of forming an opening (contact hole) by removing the insulating layer. When a composition containing an insulating layer is applied subsequently by a coating method or the like, the insulating layer is formed in a region other than the region where the substance with low wettability is formed.

After the insulating layer is heated, dried, and so on to be solidified, the substance with low wettability is removed to form the opening. The wiring layer is formed so as to fill the opening, and the first electrode layer 117 is formed in contact with this wiring layer. This method provides an advantage of simplifying the step because it is unnecessary to form the opening by etching.

If a top-emission type EL display panel is manufactured to have a structure in which light is emitted to the side opposite to the substrate 100 side, a composition containing a particle of a metal selected from Ag (silver), Au (gold), Cu (copper), W (tungsten), Al (aluminum), and the like as its main component can be used. As another method, the first electrode layer 117 may be formed in such a way that a transparent conductive film or a light-reflective conductive film is formed by a sputtering method, a mask pattern is formed by a droplet discharging method, and an etching process is combined therewith.

The first electrode layer 117 may be subjected to washing and polishing using a CMP method or a polyvinyl alcohol porous body so that its surface is flattened. After the polishing by a CMP method, the surface of the first electrode layer 117 may be subjected to ultraviolet irradiation, an oxygen plasma treatment, or the like.

In accordance with the above steps, a TFT substrate for a display panel in which a bottom-gate TFT and the first electrode layer 117 are connected to each other over the substrate 100 is completed. The TFT in this embodiment is inverted staggered.

Next, an insulator 121 (also called a partition wall or a bank) is selectively formed. The insulator 121 is formed so as to have an opening over the first electrode layer 117. In this embodiment, the insulator 121 is formed over the entire surface and patterned by etching with the use of a mask such as resist. When the insulator 121 is formed by a droplet discharging method, a printing method, or the like that can form the pattern directly and selectively, the patterning by etching is not necessarily carried out.

The insulator 121 can be formed using an inorganic insulating material such as silicon oxide, silicon nitride, silicon oxynitride, aluminum oxide, aluminum nitride, or aluminum oxynitride; an acrylic acid, a methacrylic acid, or their derivatives; a heat-resistant high-molecular material such as polyimide, aromatic polyamide, or polybenzimidazole; an insulating material of inorganic siloxane which includes a Si—O—Si bond among compounds which are formed by using a siloxane-based material as a starting material and which include silicon, oxygen, and hydrogen; or an insulating material of organic siloxane of which hydrogen bonded to silicon is substituted by an organic group such as methyl or phenyl. A photosensitive or nonphotosensitive material such as acrylic or polyimide may be used. It is preferable that the insulator 121 be formed to have a continuously-changing radius of curvature, because the coverage of an electroluminescent layer 122 and a second electrode layer 123 to be formed over the insulator 121 improves.

Subsequently, the electroluminescent layer 122 is formed. As the electroluminescent layer 122, materials showing red (R), green (G), and blue (B) light emission are selectively formed by an evaporation method or the like using evaporation masks respectively. The materials showing red (R), green (G), and blue (B) light emission can be formed by a droplet discharging method similarly to a color filter (such as a low-molecular material or a high-molecular material). Using a droplet discharging method is preferable because separate application of RGB is possible without using masks.

Figure 11A:
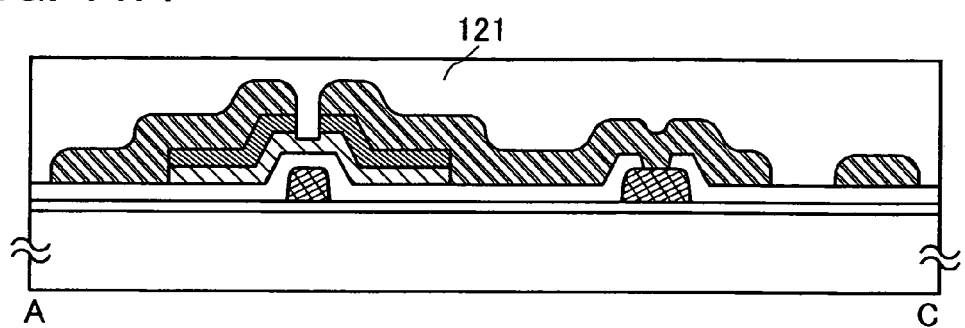
FIGS. 11A and 11B are cross-sectional views showing a method for manufacturing a display device of the present invention.
Figure 11B:
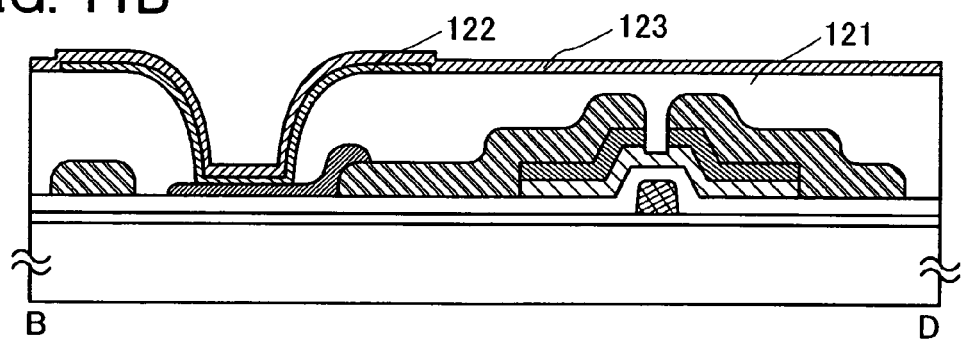

Next, the second electrode layer 123 is stacked over the electroluminescent layer 122. FIGS. 11A and 11B are cross-sectional views at this stage.

Before forming the electroluminescent layer 122, a thermal treatment is carried out in the atmospheric pressure at 200° C. to remove moisture in the first electrode layer 117 and the insulator 121 or moisture adsorbed on their surfaces. It is preferable to carry out the thermal treatment at 200 to 400° C., more preferably 250 to 350° C., under low pressure and form the electroluminescent layer 122 successively without exposing the electroluminescent layer 122 to the air by a vacuum evaporation method or a droplet discharging method.

Although not shown, it is effective to provide a passivation film so as to cover the second electrode layer 123. A protection film provided in manufacturing a display device may have a single-layer structure or a multilayer structure. The passivation film can be formed by an insulating film containing silicon nitride (SiN), silcon oxide ($SiO_2$), silicon oxynitride (SiON), silicon nitride oxide (SiNO), aluminum nitride (AlN), aluminum oxynitride (AlON), aluminum nitride oxide containing more nitrogen than oxygen (AlNO), aluminum oxide, diamond-like carbon (DLC), or carbon including nitrogen ($CN_x$) to have a single-layer structure or a multilayer structure of their combination.

Figure 12A:
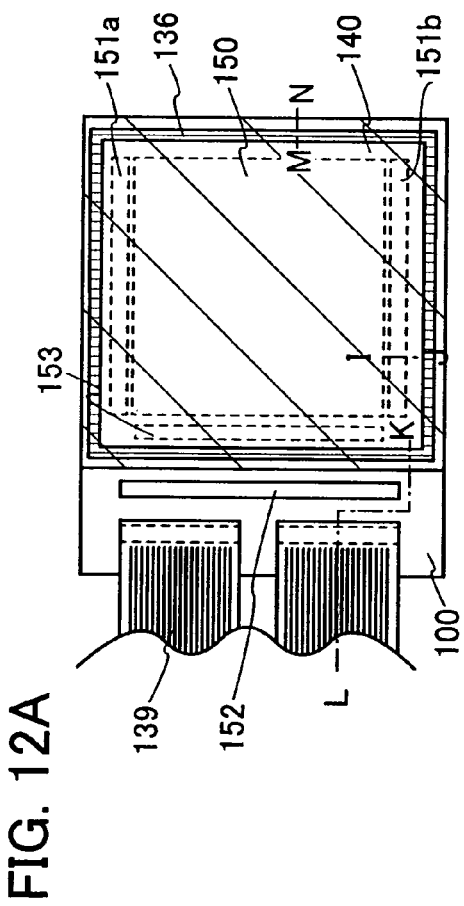
FIG. 12A is a top view and FIG. 12B is a cross-sectional view, both showing a display device of the present invention.
Figure 12B:
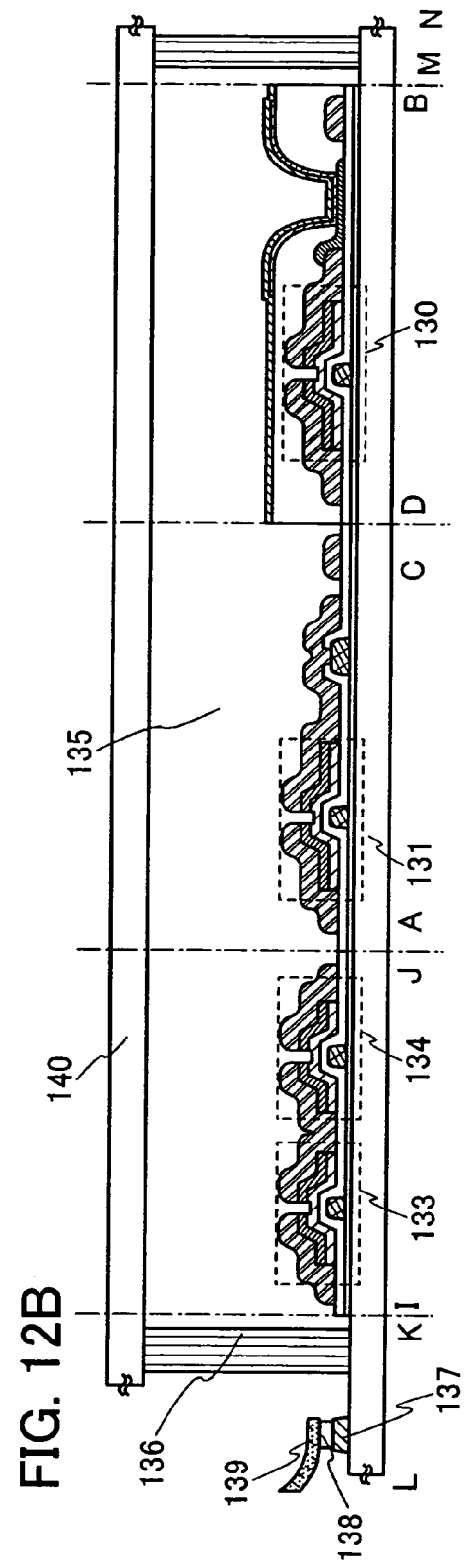

Subsequently, as shown in FIG. 12B, a sealing material 136 is formed and sealing is conducted using a sealing substrate 140. After that, a gate wiring layer formed by being electrically connected to the gate electrode layer 107 may be connected to a flexible wiring board for external electric connection. This similarly applies to a source wiring layer formed by being electrically connected to the source or drain electrode layer 113 that also serves as a source wiring layer.

A space between the substrate 100 and the sealing substrate 140 is filled with filler 135 to be sealed. The space can be filled with filler by a dripping method similarly to a liquid crystal material. The filler 135 may be replaced by inert gas such as nitrogen. Moreover, deterioration of a light-emitting element due to moisture can be prevented by providing a drying agent in a display device. The drying agent may be provided either on the sealing substrate 140 side or the element-formed substrate 100 side, in such a way that a depressed portion is formed in a region of the substrate where the sealing material 136 is formed. When the drying agent is provided in a position corresponding to a region that does not contribute to displaying such as a driving circuit region or a wiring region of the sealing substrate 140, the aperture ratio is not lowered even if the drying agent is not transparent. The filler 135 may be formed by including a moisture-absorption material so as to have a function of a drying agent. Thus, a display device having a display function using a light-emitting element is completed.

An FPC 139 is attached to a terminal electrode layer 137 for electrically connecting the inside of the display device to the outside, and the FPC 139 is electrically connected to the terminal electrode layer 137.

FIG. 12A is a top view of the display device. As shown in FIG. 12A, a pixel region 150, a scanning line driving region 151a, a scanning line driving region 151b, and a connection region 153 are sealed between the substrate 100 and the sealing substrate 140 by the sealing material 136, and a signal line driving circuit 152 formed by an IC driver is provided over the substrate 100. The driving circuit region is provided with a thin film transistor 133 and a thin film transistor 134, and a pixel region is provided with a thin film transistor 131 and a thin film transistor 130.

Although this embodiment shows a case of sealing the light-emitting element by a glass substrate, any of the following methods is used for the sealing treatment which is to protect the light-emitting element from moisture: (1) a method of mechanically sealing by a cover member, (2) a method of sealing by a thermosetting resin or an ultraviolet curable resin, and (3) a method of sealing by a thin film having high barrier property such as a metal oxide or a metal nitride. The cover member may be made of glass, ceramic, plastic, or metal and needs to have a light-transmitting property if light is emitted to the cover member side. The cover member and the substrate where the light-emitting element is formed are attached to each other by a sealing material such as a thermosetting resin or an ultraviolet curable resin, and then the resin is hardened by a thermal treatment or an ultraviolet irradiation treatment to form an airtight space. It is also effective to provide a moisture-absorption material typified by barium oxide in this airtight space. This moisture-absorption material may be provided on the sealing material or may be provided over the partition wall or in its periphery so as not to interrupt light emission from the light-emitting element. Moreover, the space between the cover member and the substrate where the light-emitting element is formed can be filled with a thermosetting resin or an ultraviolet curable resin. In this case, it is effective to add a moisture-absorption material typified by barium oxide in the thermosetting resin or the ultraviolet curable resin.

As thus described, in this embodiment, a display panel can be manufactured easily even by using a glass substrate of the fifth generation or later with a size of 1000 mm or more on one side when various kinds of patterns are formed over the substrate by a droplet discharging method.

By the manufacturing method of the present invention which uses segmented raster data and a droplet discharging apparatus, wires and the like can be formed accurately even by a design in which the wires and the like are arranged with high density and complexity due to reduction in size and film thickness.

In addition, the manufacturing method of the present invention enables a desired pattern to be formed with high adhesion. Moreover, since loss of the materials is little, cost reduction can be achieved. Therefore, a highly-reliable display device of high performance can be manufactured with high yield.

This embodiment can be freely combined with any of Embodiment Modes 1 to 3.

Embodiment 2

Figure 13A:
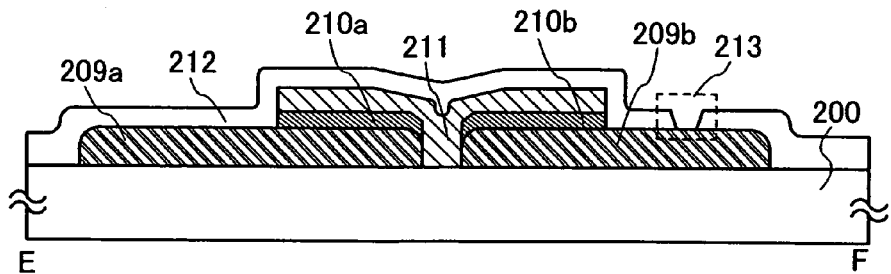
FIGS. 13A to 13C are cross-sectional views showing a method for manufacturing a display device of the present invention.
Figure 13B:
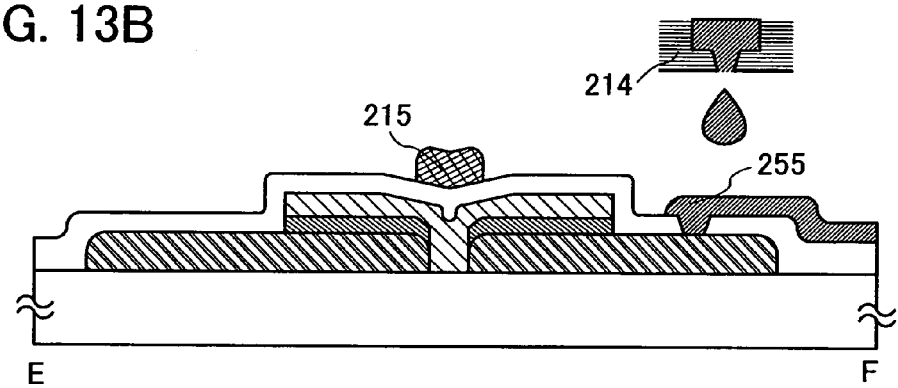
Figure 13C:
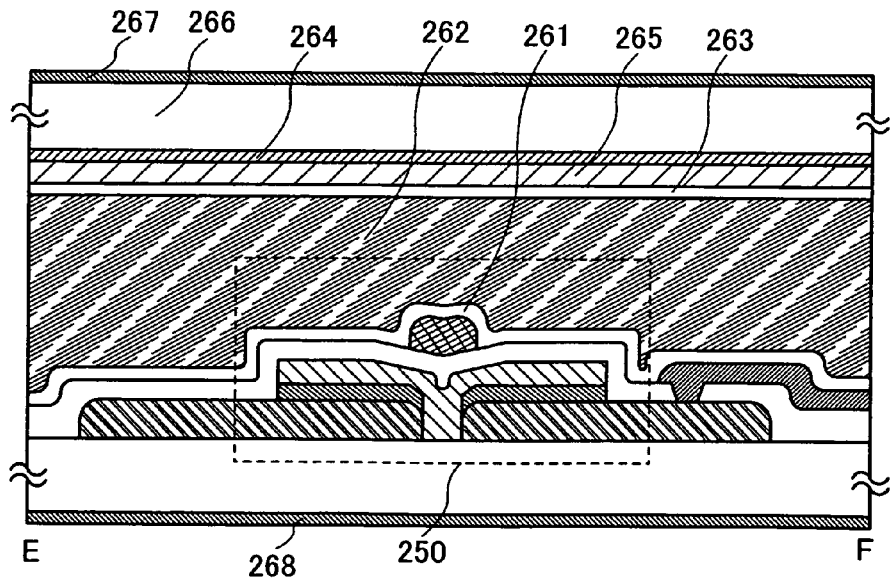
Figure 14:
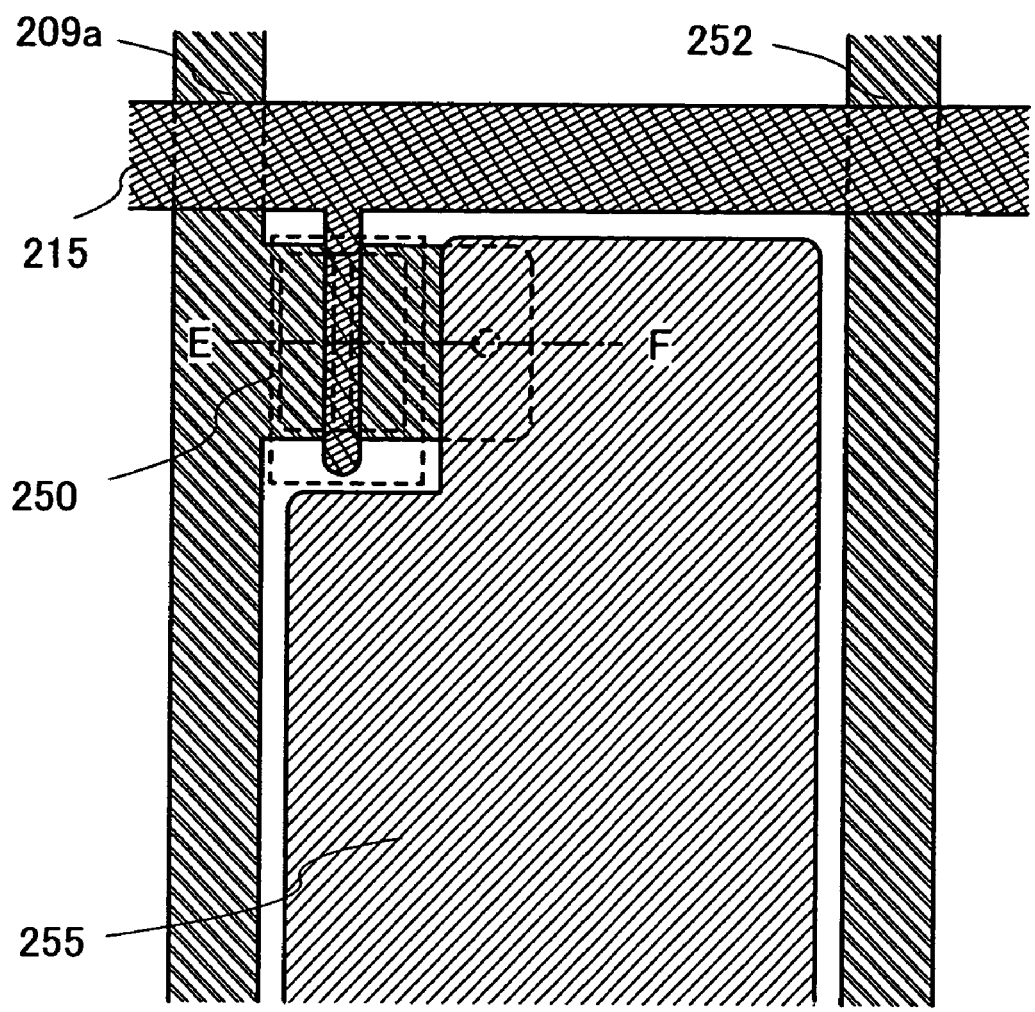
FIG. 14 is a top view showing a method for manufacturing a display device of the present invention.

This embodiment will describe an example of a liquid crystal display device using a liquid crystal material as a display element with reference to FIGS. 13A to 15B. More specifically, a method for manufacturing a display device having a thin film transistor of a top-gate planar structure will be described. FIG. 14 is a top view in which a part of a pixel portion of a display device is expanded. FIG. 13C is a cross-sectional view along a line E-F in FIG. 14. The description on the same parts or parts having similar functions is omitted.

First, a substrate 200 is prepared. The substrate 200 is a glass substrate made of barium borosilicate glass, aluminoborosilicate glass, or the like; a quartz substrate; a metal substrate; or a plastic substrate having heat resistance that can withstand process temperature of the manufacturing steps.

Next, a liquid composition containing a conductive material is discharged over the substrate by a droplet discharging apparatus. Subsequently, the composition is baked, dried, and so on to be solidified, thereby forming a source or drain electrode layer 209a and a source or drain electrode layer 209b.

Next, an n-type semiconductor layer is formed over the source or drain electrode layer 209a and the source or drain electrode layer 209b. Subsequently, a mask is formed by resist or the like by a droplet discharging method, with which the n-type semiconductor layer is selectively etched. Next, a semiconductor layer is formed over the n-type semiconductor layer and etched again selectively by using a mask or the like. Thus, an n-type semiconductor layer 210a, an n-type semiconductor layer 210b, and a semiconductor layer 211 are formed.

Next, a gate insulating layer 212 is formed over the source or drain electrode layers, and the semiconductor layer. The gate insulating layer 212 may be formed by a known material such as an oxide material of silicon or a nitride material of silicon to have a single-layer structure or a multilayer structure. In this embodiment, the gate insulating layer 212 has a three-layer structure of a silicon nitride film, a silicon oxide film, and a silicon nitride film.

Subsequently, a mask is formed over the gate insulating layer 212 by resist or the like and the gate insulating layer 212 is etched to form a through hole 213 (see FIG. 13A). In this embodiment, the mask is selectively formed by a droplet discharging method.

Next, a composition containing a conductive material is discharged over the gate insulating layer 212 by a droplet discharging apparatus 214 to form a gate electrode layer 215. When using the manufacturing method of the present invention that uses segmented raster data and a droplet discharging apparatus, the electric field effect mobility of the TFT improves because the width of the gate electrode layer 215 in the channel direction can be narrowed.

Next, a pixel electrode 255 is formed by a droplet discharging method (see FIG. 13B). In the previously formed through hole 213, the pixel electrode 255 is electrically connected to the source or drain electrode layer 209b. The pixel electrode 255 can be formed with a similar material to the first electrode layer 117 as aforementioned. In the case of manufacturing a transmissive liquid crystal display panel, the pixel electrode may be formed by discharging from a droplet discharging apparatus a composition containing indium tin oxide (ITO), indium tin oxide containing silicon oxide (ITSO), zinc oxide (ZnO), tin oxide ($SnO_2$), or the like in a predetermined shape and baking the composition.

FIG. 14 is a top view of a pixel region of the display device. The pixel region is provided with a thin film transistor 250, which is a staggered thin film transistor; the source or drain electrode layer 209a, which also functions as a source wiring layer; a capacitor wiring layer 252; the gate electrode layer 215, which also functions as a gate wiring layer; and the pixel electrode 255. The thin film transistor 250 may have a multigate structure. The pixel electrode 255 is electrically connected to the source or drain electrode layer of the thin film transistor 250.

Next, an insulating layer 261 called an orientation film is formed by a printing method or a spin coating method so as to cover the pixel electrode 255 and the thin film transistor 250. The insulating layer 261 can be selectively formed by a screen printing method or an offset printing method. After that, rubbing is carried out. Then, a sealing material 282 is formed by a droplet discharging method around a region where the pixels are formed.

After that, a counter substrate 266 where the insulating layer 263 functioning as an orientation film, a colored layer 264 functioning as a color filter, a conductive layer 265 functioning as a counter electrode, and a polarizing plate 267 are provided is attached to the substrate 200 having the TFTs through a spacer 281, and the space between the two substrates is provided with a liquid crystal layer 262. Thus, a liquid crystal display device can be manufactured. A polarizing plate 268 is also formed on the side of the substrate 200 where the TFTs are not provided. FIG. 13C shows a cross-sectional structure of the liquid crystal display device after completing these steps. Filler may be mixed in the sealing material, and a blocking film (black matrix) or the like may be formed over the counter substrate 266. As a method for forming the liquid crystal layer, a dispenser method (dripping method) or a dipping method (pumping method) in which a liquid crystal is injected by a capillary phenomenon after attaching the counter substrate 266 may be used.

Figure 16:
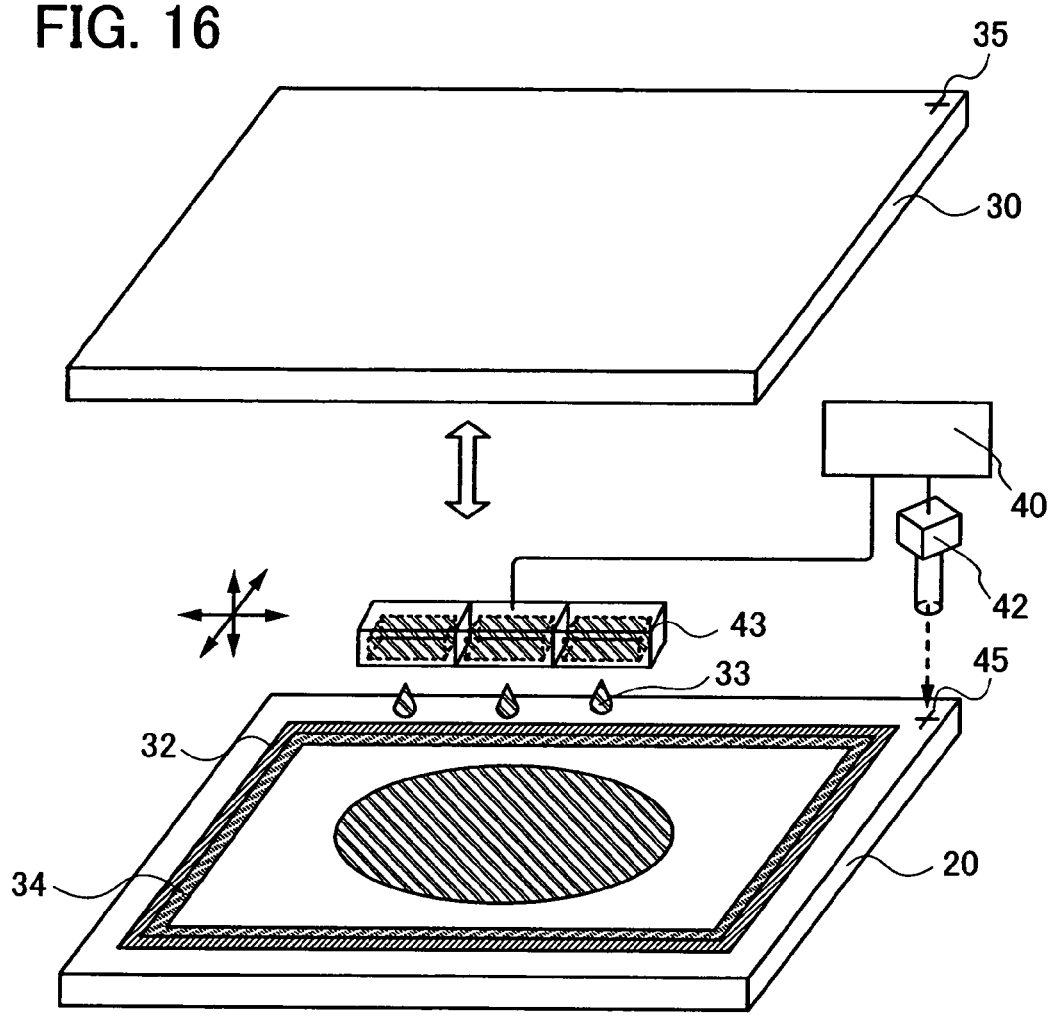
FIG. 16 shows a structure of a droplet dripping apparatus.

A liquid crystal dripping method employing a dispenser method is described with reference to FIG. 16. In FIG. 16, reference numeral 40 denotes a control device; 42, an imaging means; 43, a head; 33, a liquid crystal; 35 and 45, markers; 34, a barrier layer; 32, a sealing material; 30, a TFT substrate; and 20, a counter substrate. A closed loop is formed by the sealing material 32, and the liquid crystal 33 is dripped once or multiple times by the head 43 in the closed loop. The head 43 is provided with a plurality of nozzles, by which a large amount of liquid crystal material can be dripped at one time; thus, throughput is increased. In the case where the liquid crystal material has high viscosity, the material is discharged continuously and attached to the region with the drops connected to each other. Meanwhile, if the liquid crystal material has low viscosity, the drops are discharged and dripped intermittently. The barrier layer 34 is provided in order to prevent the sealing material 32 from reacting with the liquid crystal 33 at this time. Next, the substrates are attached to each other in vacuum, followed by ultraviolet curing, thereby obtaining a state that the space between the substrates is filled with the liquid crystal. Alternatively, the sealing material may be formed on the TFT substrate side, and the liquid crystal may be dripped.

A spacer may be provided in such a way that particles each having a size of several micrometers are sprayed. This embodiment employs a method in which a resin film is formed all over the surface of the substrate and the resin film is patterned. A material of such a spacer is applied by a spinner and then light-exposed and developed to form a predetermined pattern. Moreover, the spacer is heated at 150 to 200° C. by a clean oven or the like to be hardened. The thus manufactured spacer can have various shapes depending on the condition of light exposure and development processes. It is preferable that the spacer have a columnar shape with a flat top because mechanical strength as the liquid crystal display device can be secured when the counter substrate is attached. The shape can be circular conic, pyramid, or the like without particular limitation.

A connection portion is formed next in order to connect an external wiring board with the inside of the display device formed in accordance with the aforementioned steps. An insulating layer in the connection portion is removed by an aching process using oxygen gas under atmospheric pressure or its vicinity. This process uses oxygen gas and one or more selected from hydrogen, $CF_4$, $NF_3$, $H_2O$, and $CHF_3$. In this step, the aching process is conducted after sealing by the counter substrate in order to prevent damage or breaking due to static electricity. If an effect by static electricity is little, the aching process may be carried out at any timing.

Subsequently, the terminal electrode layer electrically connected to the pixel portion is provided with an FPC, i.e., a wiring board for connection, through an anisotropic conductive layer. An FPC is to convey external signals or potentials. In accordance with the above steps, a liquid crystal display device having a display function can be manufactured.

Figure 15A:
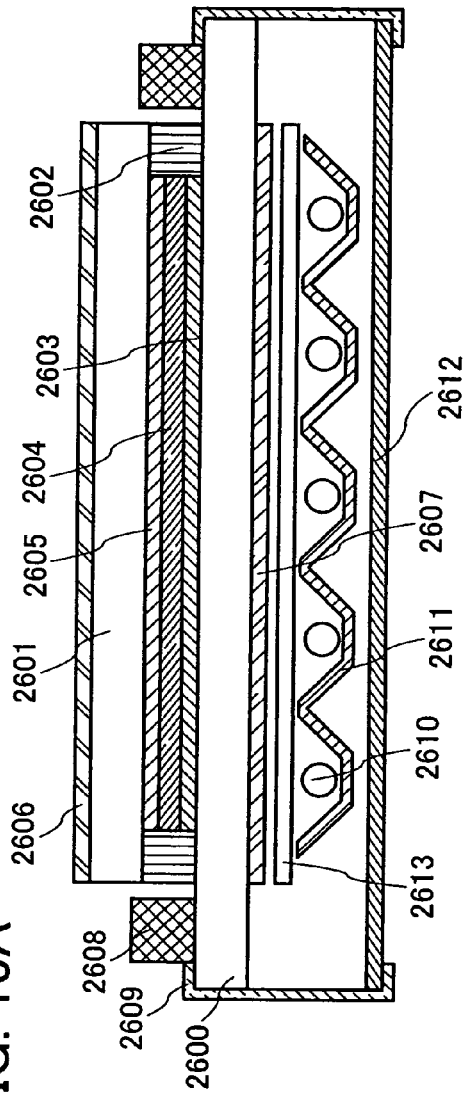
FIGS. 15A and 15B are cross-sectional views showing structural examples of a liquid crystal display module.

FIG. 15A shows an example of a liquid crystal display module that includes a display region in which a TFT substrate 2600 and a counter substrate 2601 are attached to each other by a sealing material 2602 and a pixel portion 2603 and a liquid crystal layer 2604 are provided between the two substrates. A colored layer 2605 is necessary for color display. In the case of RGB, colored layers corresponding to red, green, and blue are provided in accordance with each pixel. Polarizing plates 2606 and 2607 and a lens film 2613 are provided outside the TFT substrate 2600 and the counter substrate 2601. A light source has a cold-cathode tube 2610 and a reflecting plate 2611 in its structure. A circuit substrate 2612 is connected to the TFT substrate 2600 by a flexible wiring board 2609 and incorporates external circuits such as a control circuit and a power source circuit. Reference numeral 2608 denotes a driving circuit. A liquid crystal display module can employ a TN (Twisted Nematic) mode, an IPS (In-Plane-Switching) mode, an MVA (Multi-domain Vertical Alignment) mode, an ASM (Axially Symmetric aligned Micro-cell) mode, an OCB mode, or the like.

Figure 15B:
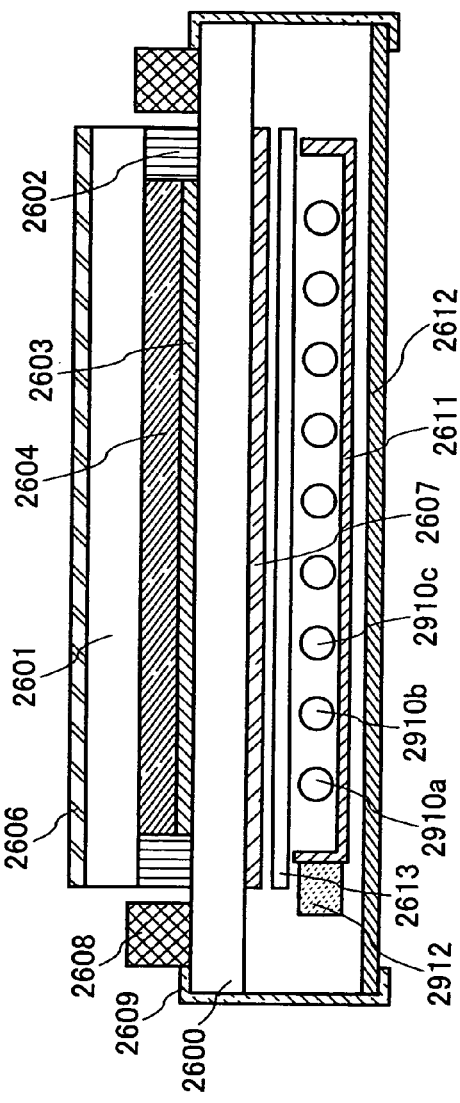

FIG. 15B shows an example of an FS-LCD (Field Sequential-LCD) in which an OCB mode is applied to the liquid crystal display module of FIG. 15A. An FS-LCD emits red light, green light, and blue light during one frame period and can perform color display by combining images using time division. Since each light is emitted by a light-emitting diode, a cold-cathode tube, or the like, a color filter is not necessary. Thus, it is not necessary to arrange color filters of three primary colors; therefore, pixels can be increased by nine times in the same area. On the other hand, since three colors of light are emitted in one frame period, high-speed response is required for a liquid crystal. By employing an FS method and an OCB mode, a display device or a liquid crystal television device with higher performance and higher image quality can be completed.

A liquid crystal layer in the OCB mode has a so-called π-cell structure. In the π-cell structure, liquid crystal molecules are oriented so that their pretilt angles are plane-symmetric along a center plane between an active matrix substrate and a counter substrate. An orientation state of a π-cell structure becomes sprayed orientation when voltage is not applied between the substrates and shifts to a bent orientation when voltage is applied therebetween. When voltage is applied further, liquid crystal molecules of a bent orientation get orientated perpendicular to the both substrates so that light can transmit. With the OCB mode, response with about 10 times higher speed than a conventional TN mode can be achieved.

Moreover, as a mode corresponding to the FS method, an SS-FLC or an HV-FLC using a ferroelectric liquid crystal (FLC) capable of high-speed operation, or the like can also be used. The OCB mode uses a nematic liquid crystal having relatively low viscosity, while the HV-FLC or the SS-FLC uses a smectic liquid crystal. Moreover, a material such as an FLC, a nematic liquid crystal, or a smectic liquid crystal can be used as the liquid crystal material.

Moreover, optical response speed of a liquid crystal display module gets higher by narrowing cell gap of the liquid crystal display module. In addition, the optical response speed can also be higher by decreasing the viscosity of the liquid crystal material. The increase in response speed is advantageous particularly when a pixel in a pixel region of a liquid crystal display module of a TN mode or a dot pitch is 30 μm or less.

FIG. 15B shows a transmissive liquid crystal display module, in which a red light source 2910a, a green light source 2910b, and a blue light source 2910c are provided as light sources. The light sources are provided with a control portion 2912 in order to switch the red light source 2910a, the green light source 2910b, and the blue light source 2910c. The control portion 2912 controls light emission of each color, so that light enters the liquid crystal to combine images by time division, thereby performing color display.

Thus, by the manufacturing method of the present invention that uses segmented raster data and a droplet discharging apparatus, the liquid crystal display module with high performance can be manufactured at low cost.

This embodiment can be freely combined with any of Embodiment Modes 1 to 3.

Embodiment 3

Figure 18:
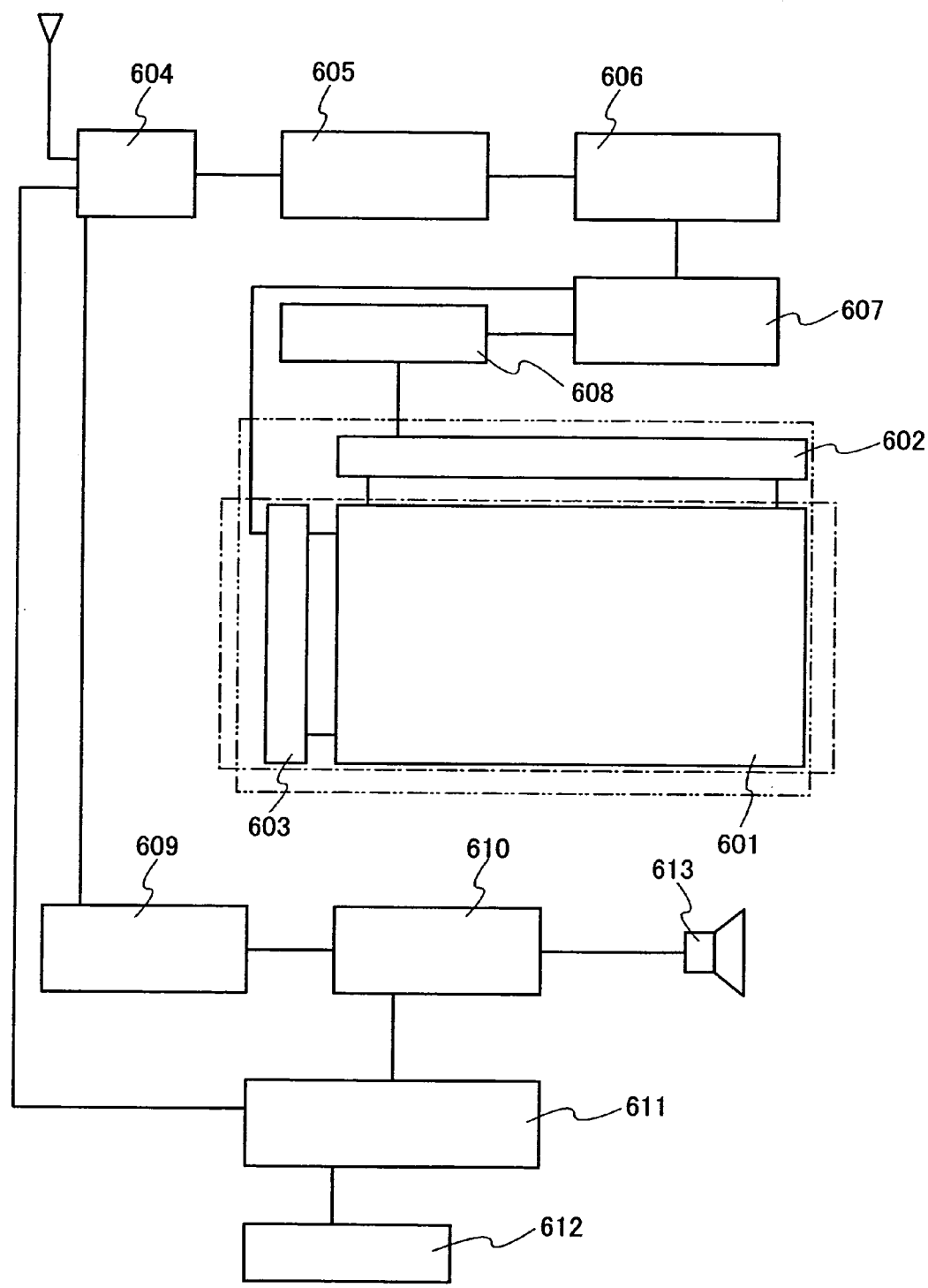
FIG. 18 is a block diagram showing a main structure of an electronic appliance to which the present invention is applied.

A television device can be completed by a display device formed by a manufacturing method of the present invention that uses segmented raster data and a droplet discharging apparatus. FIG. 18 is a block diagram showing a main structure of the television device.

A display panel shown in FIG. 18 has a pixel portion 601, a scanning line side driving circuit 603, and a signal line side driving circuit 602 and can have any of structures shown in FIGS. 21A, 21B, 22A, 22B, and 22C.

Figure 21A:
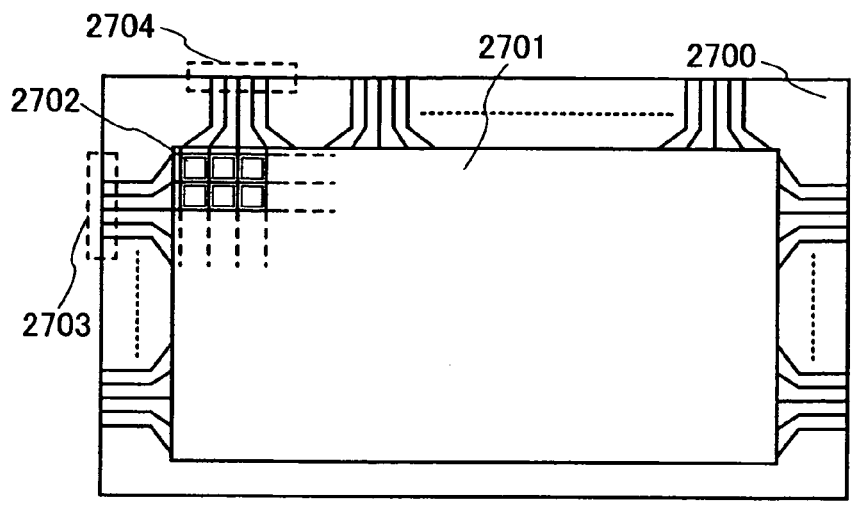
FIGS. 21A to 21C are top views showing display devices of the present invention.

FIG. 21A is a top view showing an example of a structure of the display panel, in which a pixel portion 2701 having pixels 2702 arrayed in a matrix form over a substrate 2700 having an insulating surface, a scanning line side input terminal 2703, and a signal line side input terminal 2704 are formed. The number of pixels may be determined based on various specifications, and it may be 1024×768×3 (RGB) for XGA, 1600×1200×3 (RGB) for UXGA, and 1920×1080×3 (RGB) for full-specification high-definition.

The pixels 2702 are provided in a matrix form by intersecting a scanning line extended from the scanning line side input terminal 2703 and a signal line extended from the signal line side input terminal 2704. Each of the pixels 2702 is provided with a switching element and a pixel electrode connected to the switching element. A typical example of the switching element is a TFT. By connecting a gate electrode side of the TFT to the scanning line and connecting a source or drain side of the TFT to the signal line, each pixel can be independently controlled by external signals.

FIG. 21A shows a structure of the display panel for controlling signals to be inputted to the scanning line and the signal line by an externally attached driving circuit.

Figure 22A:
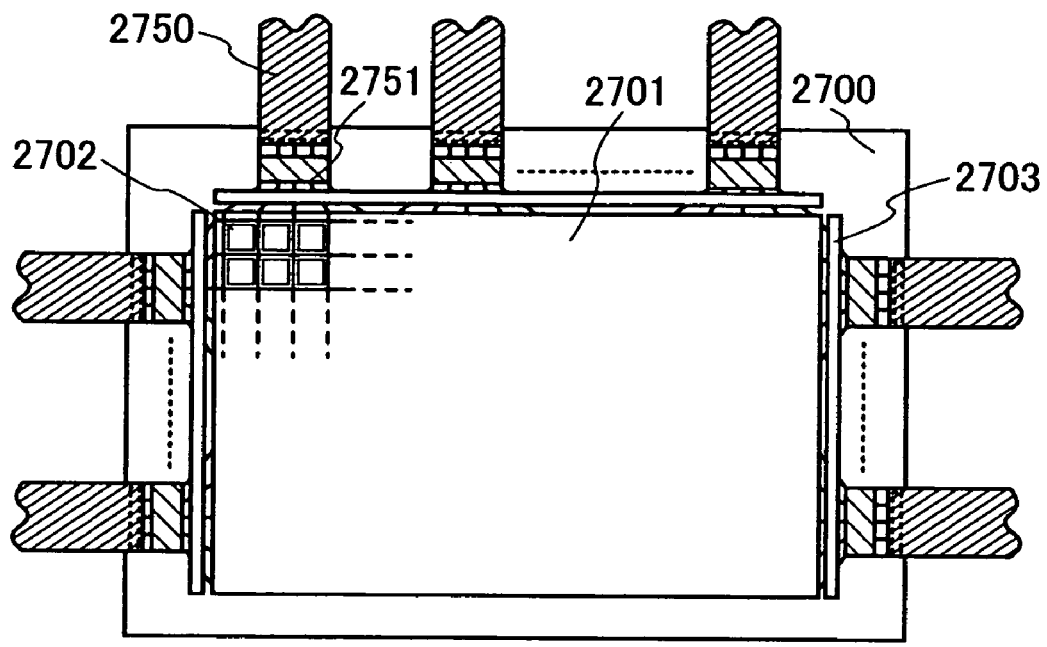
FIGS. 22A and 22B are top views showing display devices of the present invention.
Figure 22B:
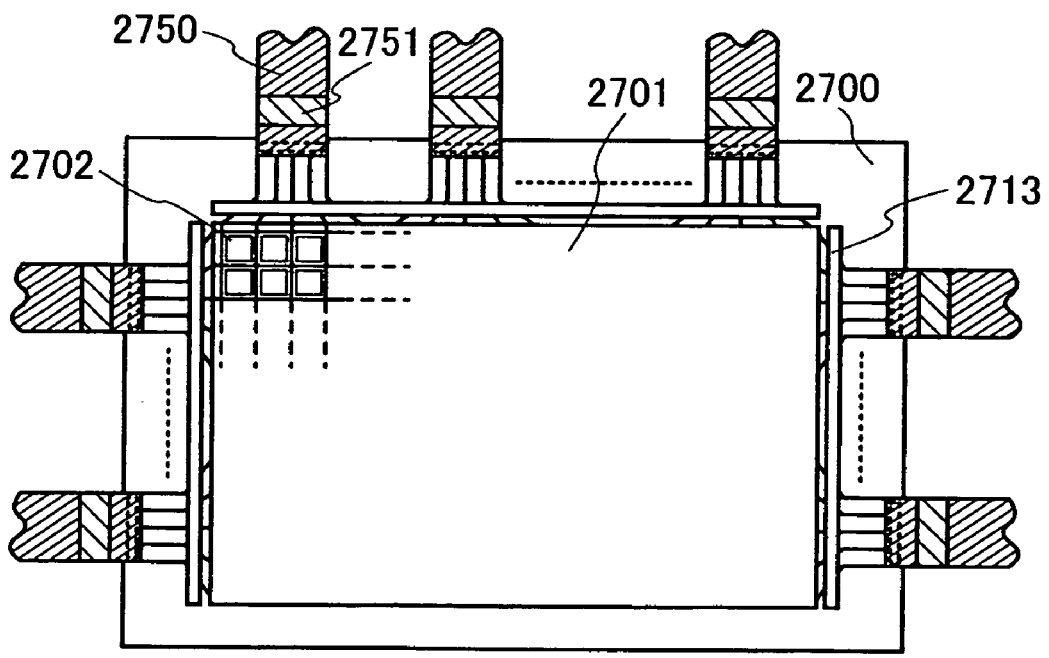

In addition to the structure shown in FIG. 21A, the display panel may be mounted by a TAB (Tape Automated Bonding) method as shown in FIG. 22B or by a COG (Chip on Glass) method as shown in FIG. 22A. In FIG. 22B, a driver IC 2751 is connected to an FPC 2750. In FIG. 22A, the driver IC 2751 is mounted over the substrate 2700.

Figure 21B:
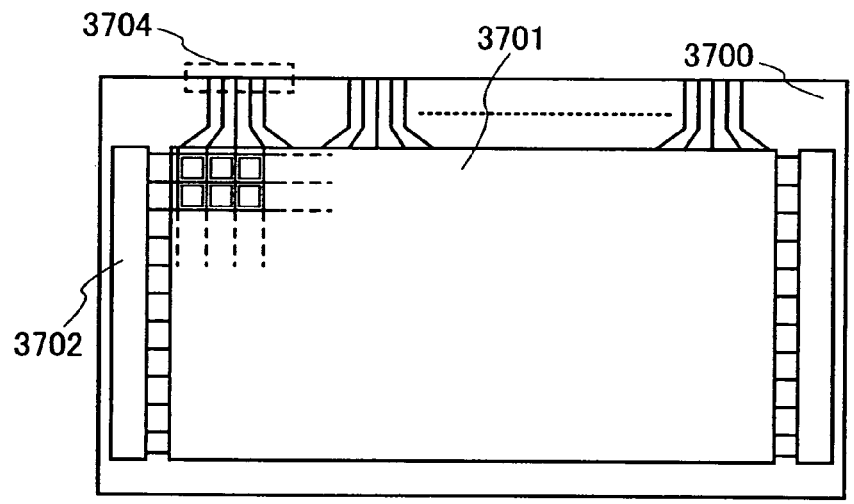

The display panel may have a structure shown in FIG. 21B, in which TFTs are formed and a pixel portion and a scanning line side driving circuit are formed over one substrate, and a signal line side driving circuit is mounted separately as a driver IC.

Figure 21C:
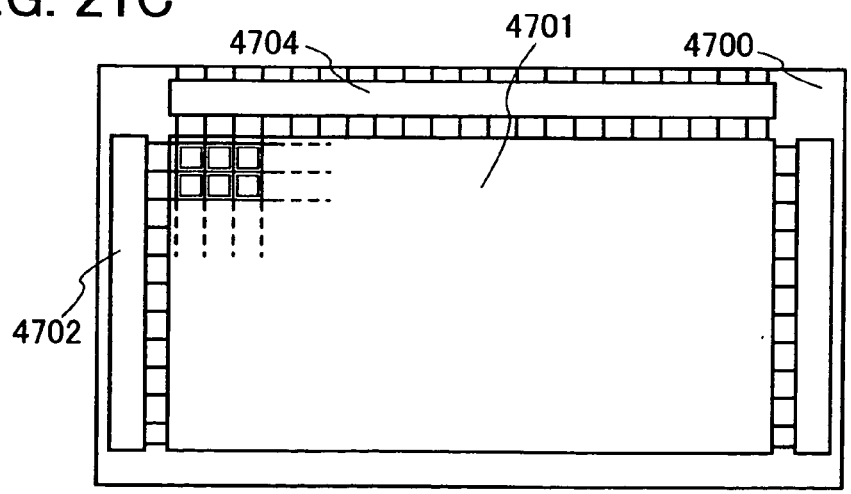

Moreover, the display panel may have a structure shown in FIG. 21C, in which a pixel portion, a signal line side driving circuit, and a scanning line side driving circuit are formed over one substrate.

Another external circuit has a structure including the following, on an input side of video signals: a video signal amplifying circuit 605 for amplifying video signals among signals received by a tuner 604, a video signal processing circuit 606 for converting the signals outputted from the video signal amplifying circuit 605 into color signals corresponding to red, green, and blue, a control circuit 607 for converting the video signals in accordance with input specification of the driver IC, and the like. The control circuit 607 outputs signals to the scanning line side driving circuit and the signal line side driving circuit. For digital driving, the signal line side driving circuit is provided with a signal dividing circuit 608 to divide an inputted digital signal into m units and supply the divided signals.

Among the signals received by the tuner 604, an audio signal is sent to an audio signal amplifying circuit 609 and its output is supplied to a speaker 613 through an audio signal processing circuit 610. A control circuit 611 receives control information of a receiving station (receiving frequency) or volume from an input portion 612 and sends signals to the tuner 604 or the audio signal processing circuit 610.

Figure 17A:
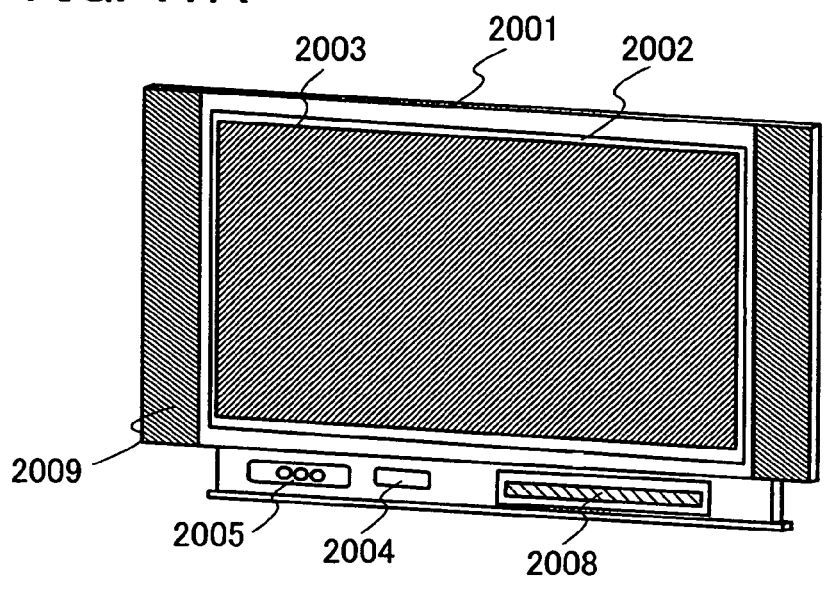
FIGS. 17A and 17B show electronic appliances to which the present invention is applied.
Figure 17B:
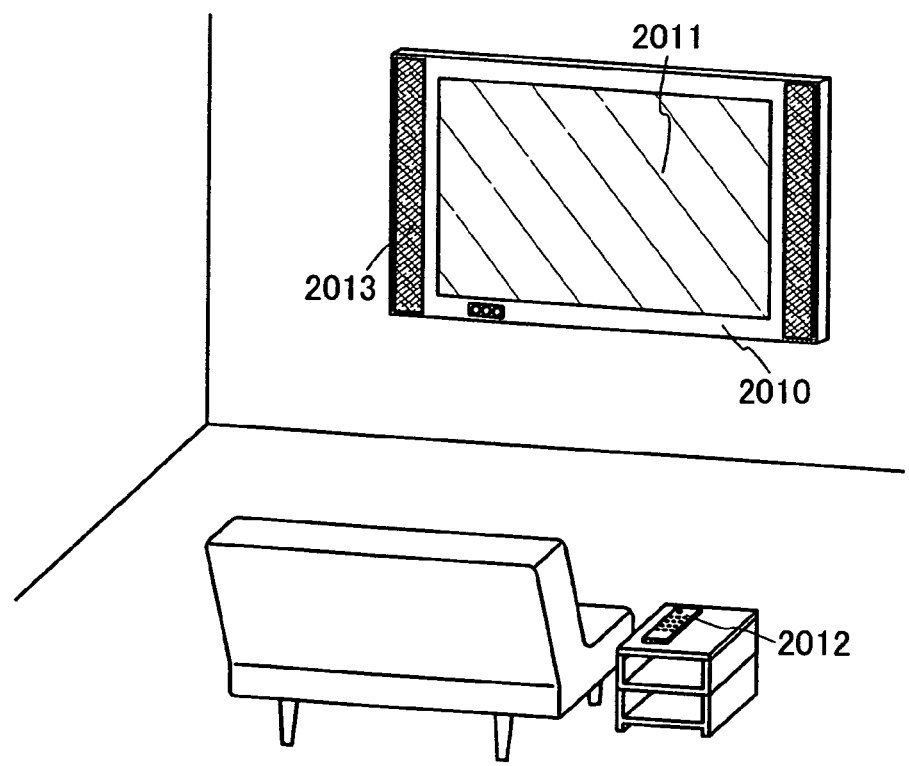

By incorporating these liquid crystal display module and EL display module in housings as shown in FIGS. 17A and 17B, a television device can be completed. With the EL display module shown in FIGS. 12A and 12B, an EL television device can be completed. When the liquid crystal display modules shown in FIGS. 15A and 15B are used, liquid crystal television devices can be completed. A main screen 2003 is formed by the display module and a speaker portion 2009, operation switches, and the like are provided as other additional facilities. A television device can be completed by a manufacturing method of the present invention that uses segmented raster data and a droplet discharging apparatus.

A display panel 2002 is incorporated in the housing 2001, and general television broadcasting can be received by a receiving machine 2005. In addition, by being connected to communication network with or without a wire through a modem 2004, unidirectional (senders to receivers) or bidirectional (between senders and receivers or between receivers) information communication is possible. The television device can be operated by a switch incorporated in the housing or a remote control device 2006 as an accessory. The remote control device may also be provided with a display portion 2007 for displaying the information to be outputted therefrom.

In addition, the television device may be provided with a subscreen 2008 by a second display panel besides the main screen 2003, so that a structure for displaying a channel, volume, or the like is added. In this structure, the main screen 2003 may be formed by an EL display panel superior in a viewing angle and the subscreen may be formed by a liquid crystal display panel capable of displaying with low power consumption. In order to put priority on low power consumption, the main screen 2003 may be formed by a liquid crystal display panel and the subscreen may be formed by an EL display panel and the subscreen may be capable of blinking. By the manufacturing method of the present invention that uses segmented raster data and a droplet discharging apparatus, a display device can be completed at low cost even by using a number of TFTs and electronic components and a large substrate of the sixth generation: 1500×1800 mm, the seventh generation: 1870×2200 mm, the eighth generation: 2160×2400 mm, or the like.

FIG. 17B shows a television device having a large display portion of, for example, 20 to 80 inches, which includes a housing 2010, a display portion 2011, a remote control device 2012 serving as an operation portion, a speaker portion 2013, and the like. A manufacturing method of the present invention that uses segmented raster data and a droplet discharging apparatus is applied to manufacture the display portion 2011. The television device in FIG. 17B is a wall-hanging television device that does not require a wide space for installation.

It is needless to say that the present invention can be applied to not only the television device but also various applications including a monitor of a personal computer, an information display board at a railway station, an airport, or the like, and particularly a large-area display medium such as an advertisement display board at streets.

This embodiment can be freely combined with any of Embodiment Modes 1 to 3 and Embodiments 1 and 2.

Embodiment 4

Various display devices can be manufactured by applying a manufacturing method of the present invention using segmented raster data and a droplet discharging apparatus. That is to say, the present invention can be applied to various electronic appliances in which those display devices are incorporated in their display portions.

Such electronic appliances correspond to a camera such as a video camera or a digital camera, a projector, a head mount display (goggle type display), a car navigation system, a car stereo, a personal computer, a game machine, a portable information terminal (mobile computer, portable phone, or electronic book), an image reproducing device equipped with a recording medium (specifically, a device which reproduces a recording medium such as a digital versatile disk (DVD) and which has a display for displaying the image), and the like. Examples of those are shown in FIGS. 19A to 19D.

Figure 19A:
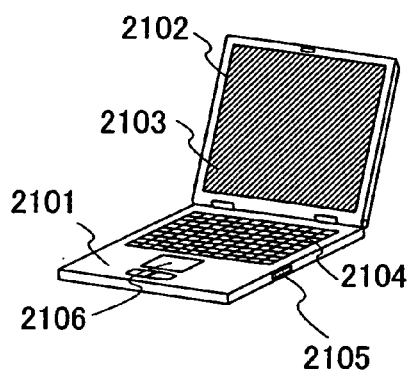
FIGS. 19A to 19D show electronic appliances to which the present invention is applied.

FIG. 19A shows a personal computer including a main body 2102, a housing 2102, a display portion 2103, a keyboard 2104, an external connection port 2105, a pointing mouse 2106, and the like. A manufacturing method of the present invention using segmented raster data and using a droplet discharging apparatus is applied to manufacture the display portion 2103. By using the present invention, a high-definition image with high reliability can be displayed even if the device is small and wires and the like are arranged with high density.

Figure 19B:
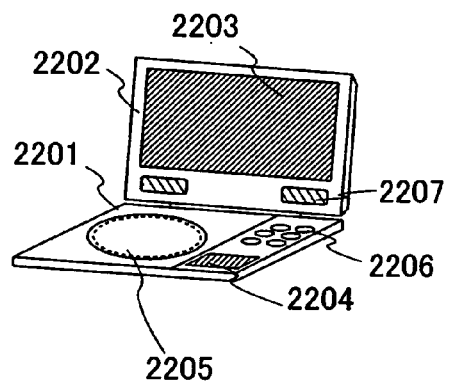

FIG. 19B shows an image reproducing device provided with a recording medium (specifically a DVD reproducing device), including a main body 2201, a housing 2202, a display portion A2203, a display portion B2204, a recording medium (DVD etc.) reading portion 2205, an operation key 2206, a speaker portion 2207, and the like. The display portion A2203 mainly displays image information while the display portion B2204 mainly displays text information. A manufacturing method of the present invention using segmented raster data and using a droplet discharging apparatus is applied to manufacture the display portion A2203 and the display portion B2204. By using the present invention, a high-definition image with high reliability can be displayed even if wires and the like are arranged with high density.

Figure 19C:
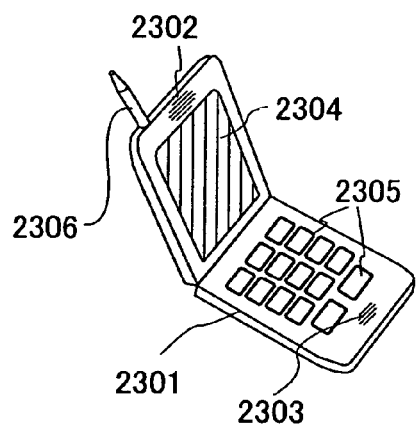

FIG. 19C shows a portable phone including a main body 2301, an audio output portion 2302, an audio input portion 2303, a display portion 2304, operation switches 2305, an antenna 2306, and the like. A display device manufactured by a manufacturing method of the present invention using segmented raster data and using a droplet discharging apparatus is applied to the display portion 2304. Accordingly, a high-definition image with high reliability can be displayed even if the portable phone is provided with the display device in which wires and the like are arranged with high density.

Figure 19D:
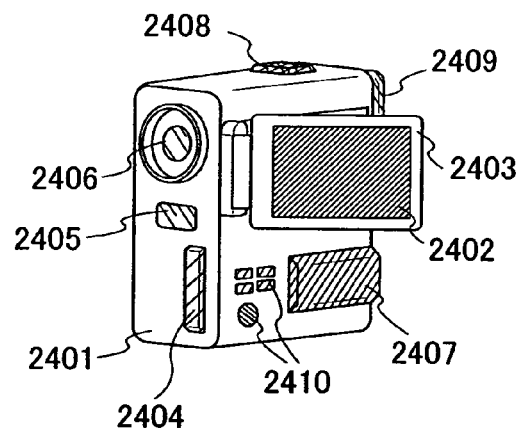

FIG. 19D shows a video camera including a main body 2401, a display portion 2402, a housing 2403, an external connection port 2404, a remote controlling portion 2405, an image receiving portion 2406, a battery 2407, an audio input portion 2408, operation keys 2409, and the like. The present invention can be applied to the display portion 2402. A display device manufactured by a manufacturing method of the present invention using segmented raster data and using a droplet discharging apparatus is applied to the display portion 2402. Accordingly, a high-definition image with high reliability can be displayed even if the video camera has the display portion in which wires and the like are arranged with high density.

This embodiment can be freely combined with any of Embodiment Modes 1 to 3 and Embodiments 1 and 2.

Embodiment 5

An example of a protection circuit provided in a display device of the present invention will be described.

A protection circuit as shown in any of FIGS. 20A to 20E can be formed between an external circuit and an internal circuit. The protection circuit is formed by one or more elements selected from a TFT, a diode, a resistor element, a capacitor element, and the like. Structures of several protection circuits and their operations will be hereinafter described. First, a structure of a protection circuit which is provided between an external circuit and an internal circuit and which corresponds to one input terminal is described with reference to equivalent circuit diagrams in FIGS. 20A to 20E. A protection circuit shown in FIG. 20A has p-channel thin film transistors 7220 and 7230, capacitor elements 7210 and 7240, and a resistor element 7250. The resistor element 7250 is two-terminal resistance, one of which is given an input voltage Vin (hereinafter referred to as Vin) and the other of which is given a low-potential voltage VSS (hereinafter referred to as VSS).

Figure 20A:
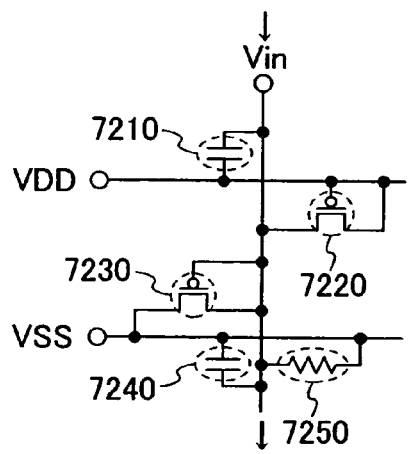
FIGS. 20A to 20E show protection circuits to which the present invention is applied.
Figure 20D:
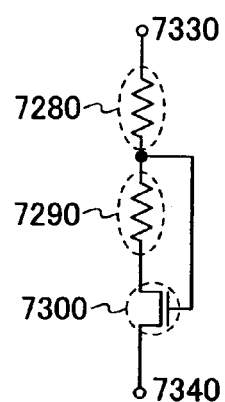
Figure 20B:
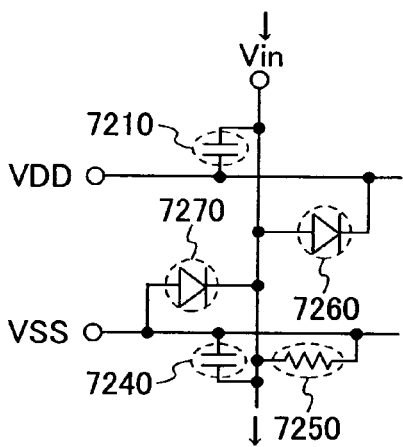
Figure 20E:
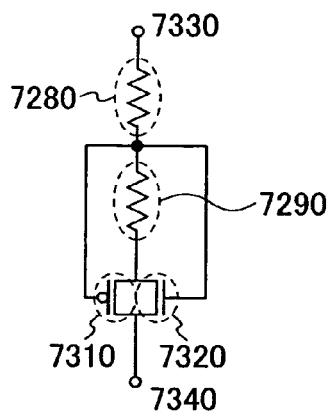
Figure 20C:
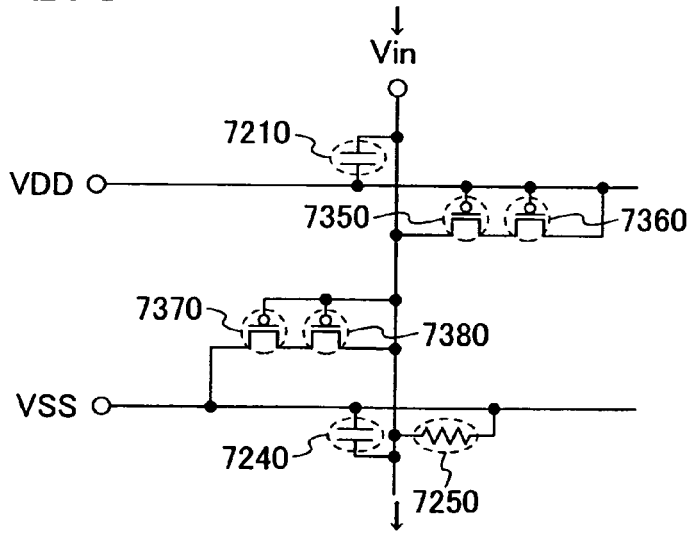

A protection circuit shown in the equivalent circuit diagram of FIG. 20B has diodes 7260 and 7270 each having a rectifying property instead of the p-channel thin film transistors 7220 and 7230. A protection circuit shown in the equivalent circuit diagram of FIG. 20C has TFTs 7350, 7360, 7370, and 7380 instead of the p-channel thin film transistors 7220 and 7230. As a protection circuit having a different structure from the aforementioned, a protection circuit shown in FIG. 20D has resistors 7280 and 7290 and an n-channel thin film transistor 7300. A protection circuit shown in FIG. 20E has the resistors 7280 and 7290, a p-channel thin film transistor 7310, and an n-channel thin film transistor 7320. The provision of the protection circuit can prevent sudden fluctuation of potentials and prevent breakdown and damage of the elements, thereby improving reliability. It is preferable that elements that form the protection circuits be constituted by an amorphous semiconductor having high resistance to pressure.

The protection circuit may be formed by manufacturing one or more elements selected from a TFT, a diode, a resistor element, a capacitor element, and the like by the manufacturing method of the present invention using segmented raster data and a droplet discharging apparatus.

Moreover, the present invention can be combined freely with any of Embodiment Modes 1 to 3 and Embodiments 1 to 4.

Embodiment 6

In accordance with a manufacturing method of the present invention using segmented raster data and a droplet discharging apparatus, a semiconductor device functioning as a processor chip (also called a wireless chip, a wireless processor, a wireless memory, or a wireless tag) can be formed. The semiconductor device of the present invention can be applied in a wide range; for example, the semiconductor device of the present invention can be provided to banknotes, coins, securities, certificates, bearer bonds, containers for package, books, recording media, personal belongings, vehicles, food items, garments, healthcare items, commodities, medicals, electronic appliances, and the like.

Figure 23A:
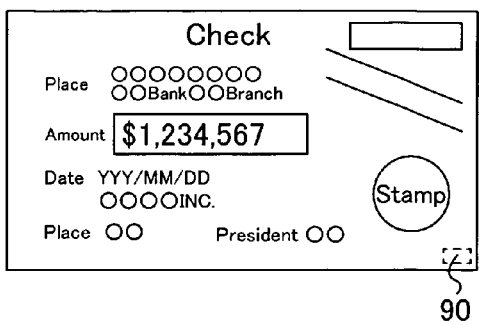
FIGS. 23A to 23G show semiconductor devices to which the present invention is applied.
Figure 23B:
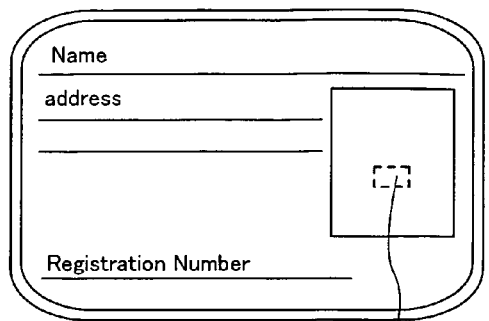
Figure 23C:
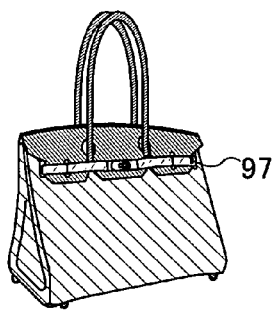
Figure 23D:
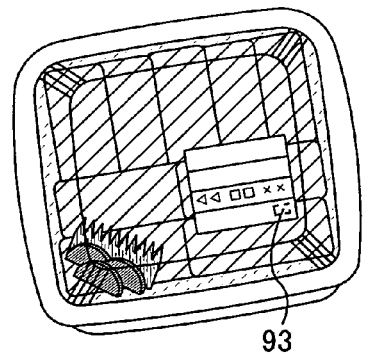
Figure 23E:
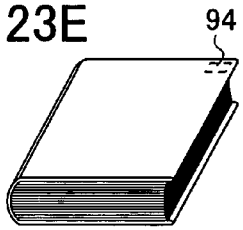
Figure 23F:
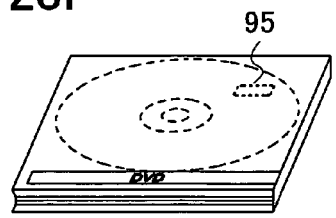
Figure 23G:
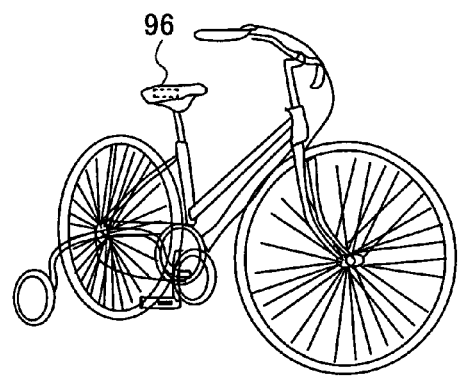

The bills and the coins mean currency that circulates in the market and include notes that are currency in a specific area (a cash voucher), memorial coins, and the like. The securities refer to a check, a stock certificate, a promissory note, and the like to which a processor chip 90 can be provided (see FIG. 23A). The certificates refer to a driver's license, a resident card, and the like to which a processor chip 91 can be provided (see FIG. 23B). The vehicles refer to a wheeled vehicle such as a bicycle, a vessel, and the like to which a processor chip 97 can be provided (see FIG. 23C). The bearer bonds refer to a stamp, a rice coupon, various gift coupons, and the like. The containers for package refer to wrapping paper for a lunch box or the like, a plastic bottle, and the like to which a processor chip 93 can be provided (see FIG. 23D). The books refer to a book, a volume, and the like to which a processor chip 94 can be provided (see FIG. 23E). The recording media refer to DVD software, a video tape, and the like to which a processor chip 95 can be provided (see FIG. 23F). The personal belongings refer to a bag, glasses, and the like to which a processor chip 96 can be provided (see FIG. 23G). The food items refer to foods, beverages, and the like. The garments refer to clothing, footwear, and the like. The healthcare items refer to a medical device, a health appliance, and the like. The medicals refer to medicine, agricultural chemicals, and the like. The electronic appliances refer to a liquid crystal display device, an EL display device, a television device (a TV receiving machine or a flat screen TV receiving machine), a mobile phone, and the like.

When processor chips are mounted on the banknotes, the coins, the securities, the certificates, the bearer bonds, and the like, forgery thereof can be prevented. When processor chips are mounted on the containers for package, the books, the recording media, the personal belongings, the food items, the commodities, the electronic appliances, and the like, the efficiency of an inspection system, a rental system at a rental shop, and the like can be improved. When processor chips are mounted on the vehicles, the healthcare items, the medicals, and the like, forgery and theft thereof can be prevented and the medicines can be prevented from being consumed in the wrong manner. The processor chip may be attached to a surface of a product or embedded inside a product. For example, the processor chip may be embedded inside a page of a book, or an organic resin of a package.

Moreover, higher performance of a system can be obtained by applying a processor chip which can be formed by a manufacturing method of the present invention that uses segmented raster data and a droplet discharging apparatus to management of products and circulation systems. For example, when information recorded in a processor chip provided to a baggage tag is read by a reader/writer provided beside a belt conveyer, the information in a circulation process, delivery destination, and the like can be read out, which can facilitate the inspection of the products and delivery of the baggage.

Figure 24:
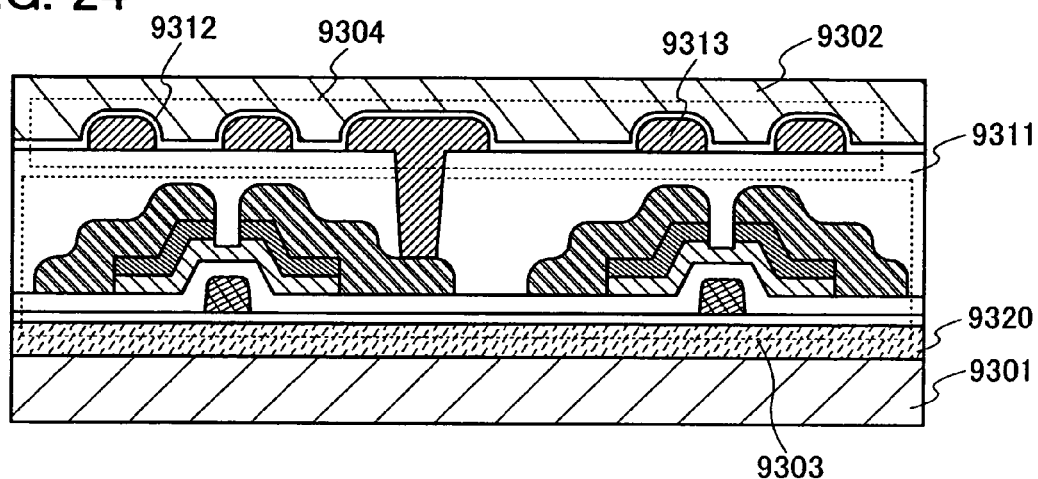
FIG. 24 is a cross-sectional view showing a structural example of a semiconductor device.

A structure of a processor chip which can be formed by a manufacturing method of the present invention that uses segmented raster data and a droplet discharging apparatus will be described with reference to FIG. 24. The processor chip is formed by a thin film integrated circuit 9303 and an antenna 9304 connected to the thin film integrated circuit 9303. The thin film integrated circuit and the antenna are sandwiched by cover materials 9301 and 9302. The thin film integrated circuit 9303 may be attached to the cover materials by an adhesive. In FIG. 24, one side of the thin film integrated circuit 9303 is attached to the cover material 9301 through the adhesive 9320.

Wires and the like of the thin film integrated circuit 9303 are formed by the droplet discharging method shown in any of Embodiment Modes 1 to 3, and the thin film integrated circuit is separated by a known separation step and provided to the cover material. A semiconductor element used for the thin film integrated circuit 9303 is not limited to this. For example, in addition to the TFT, a storage element, a diode, a photoelectric conversion element, a resistor element, a coil, a capacitor element, an inductor, or the like can be used.

As shown in FIG. 24, an interlayer insulating film 9311 is formed over the TFT of the thin film integrated circuit 9303 and the antenna 9304 to be connected to the TFT through the interlayer insulating film 9311 is formed. A barrier film 9312 is formed by a silicon nitride film or the like over the interlayer insulating film 9311 and the antenna 9304.

The antenna 9304 is formed by discharging a droplet having a conductor such as gold, silver, or copper by a droplet discharging method and drying and/or baking the droplet. By forming the antenna by a droplet discharging method, the number of steps can be reduced, thereby cost reduction can be achieved.

The cover materials 9301 and 9302 are preferably formed by a laminating film (including polypropylene, polyester, vinyl, polyvinyl fluoride, vinyl chloride, or the like), paper made of a fibrous material, a multilayer film including a base material film (polyester, polyamide, an inorganic evaporated film, paper, or the like) and an adhesive synthetic resin film (an acrylic-based synthetic resin, an epoxy-based synthetic resin, or the like), or the like. The laminating film is attached to an object to be processed, by thermocompression. In this attachment process, an adhesive layer on the surface of the laminating film or a layer provided on the outermost layer (not the adhesive layer) is melted by a thermal treatment and attached by applying pressure.

When the cover material is formed by a material which is harmless when being incinerated, such as paper, fiber, or carbon graphite, the used processor chip can be incinerated or cut. Since the processor chips using such materials generate no noxious gas even by incineration, it is harmless.

Although the cover material 9301 is provided with the processor chip through the adhesive 9320 in FIG. 24, the processor chip may be attached to a product instead of the cover material 9301 and be used.

This embodiment can be freely combined with any of Embodiment Modes 1 to 3.

According to the present invention, cost reduction of the material to be used can be achieved. Moreover, design data for another layer using an apparatus other than an ink jet apparatus (such as a laser irradiation apparatus or a light-exposure apparatus) can be shared by the present invention; therefore, a designer can easily know the whole circuit structure or wire positions.

This application is based on Japanese Patent Application serial no. 2005-275075 filed in Japan Patent Office on Sep. 22, 2005, the entire contents of which are hereby incorporated by reference.

What is claimed is:

1. A method for manufacturing a semiconductor device comprising:
   creating first circuit design diagram data for providing a first material layer over a substrate having an insulating surface by a CAD tool;
   converting the first circuit design diagram data into first raster data which determines a discharging position, regarding a dot pitch Xdp in a horizontal direction and a dot pitch Ydp in a perpendicular direction as one unit;
   creating second raster data of a dot pitch Ydp/V (V>1) by segmenting the first raster data into V units in a main scanning direction;
   thinning an arbitrary discharging number of the second raster data to create third raster data having the same discharging number as the first raster data;
   determining a head tilt angle θ between a sub scanning direction and a head major-axis direction of the droplet discharging apparatus provided with a head having a plurality of nozzles;
   creating fourth raster data in which discharging timing of each nozzle has been corrected based on the head tilt angle θ;
   forming the first material layer over the substrate having an insulating surface by discharging a droplet based on the fourth raster data, in such a way that the head and the substrate are relatively moved in the main scanning direction or the sub scanning direction while maintaining the head tilt angle θ;
   creating second circuit design diagram data for providing a second material layer over the first material layer by the CAD tool and forming the second material layer, and
   wherein the second raster data creation is so as to increase a data number in the main scanning direction by V times.

2. The method for manufacturing a semiconductor device according to claim 1,
   wherein the head tilt angle θ is determined based on arccos (dot pitch Xdp×nozzle number/a length of the major axis of the head).

3. The method for manufacturing a semiconductor device according to claim 1,
   wherein after creating the fourth raster data, the fourth raster data is corrected based on a scanning route of the head or the substrate.

4. The method for manufacturing a semiconductor device according to claim 1,
   wherein a control circuit is connected to the droplet discharging apparatus, and
   wherein the control circuit copies the circuit design diagram data from design database, and executes a program for automatically converting the circuit design diagram data into the fourth raster data.

5. The method for manufacturing a semiconductor device according to claim 1,
   wherein the main scanning direction is perpendicular to the sub scanning direction.

6. A method for manufacturing a semiconductor device comprising:
   creating first circuit design diagram data for providing a first material layer over a substrate having an insulating surface by a CAD tool;
   converting the first circuit design diagram data into first raster data which determines a discharging position, regarding a dot pitch Xdp in a horizontal direction and a dot pitch Ydp in a perpendicular direction as one unit;

creating second raster data of a dot pitch Ydp/V (V>1) by segmenting the first raster data into V units in a main scanning direction;

thinning an arbitrary discharging number of the second raster data to create third raster data having the same discharging number as the first raster data;

determining a head tilt angle θ between a sub scanning direction and a head major-axis direction of the droplet discharging apparatus provided with a head having a plurality of nozzles;

creating fourth raster data in which discharging timing of each nozzle has been corrected based on the head tilt angle θ;

forming the first material layer over the substrate having an insulating surface by discharging a droplet based on the fourth raster data, in such a way that the head and the substrate are relatively moved in the main scanning direction or the sub scanning direction while maintaining the head tilt angle θ, and wherein the second raster data creation is so as to increase a data number in the main scanning direction by V times.

7. The method for manufacturing a semiconductor device according to claim 6, further comprising:

creating second circuit design diagram data for providing a second material layer over the first material layer by the CAD tool and forming the second material layer.

8. The method for manufacturing a semiconductor device according to claim 6, wherein the head tilt angle θ is determined based on arccos (dot pitch Xdp×nozzle number/a length of the major axis of the head).

9. The method for manufacturing a semiconductor device according to claim 6, wherein after creating the fourth raster data, the fourth raster data is corrected based on a scanning route of the head or the substrate.

10. The method for manufacturing a semiconductor device according to claim 6, wherein a control circuit is connected to the droplet discharging apparatus, and wherein the control circuit copies the circuit design diagram data from design database, and executes a program for automatically converting the circuit design diagram data into the fourth raster data.

11. The method for manufacturing a semiconductor device according to claim 6, wherein the main scanning direction is perpendicular to the sub scanning direction.

12. A method for manufacturing a semiconductor device comprising:

creating first circuit design diagram data for providing a wiring over a substrate having an insulating surface by a CAD tool;

converting the first circuit design diagram data into first raster data which determines a discharging position, regarding a dot pitch Xdp in a horizontal direction and a dot pitch Ydp in a perpendicular direction as one unit;

creating second raster data of a dot pitch Ydp/V (V>1) by segmenting the first raster data into V units in a main scanning direction;

thinning an arbitrary discharging number of the second raster data to create third raster data having the same discharging number as the first raster data;

determining a head tilt angle θ between a sub scanning direction and a head major-axis direction of the droplet discharging apparatus provided with a head having a plurality of nozzles;

creating fourth raster data in which discharging timing of each nozzle has been corrected based on the head tilt angle θ;

forming the wiring over the substrate having an insulating surface by discharging a droplet based on the fourth raster data, in such a way that the head and the substrate are relatively moved in the main scanning direction or the sub scanning direction while maintaining the head tilt angle θ, and wherein the second raster data creation is so as to increase a data number in the main scanning direction by V times.

13. The method for manufacturing a semiconductor device according to claim 12, further comprising:

creating second circuit design diagram data for providing a material layer over the wiring by the CAD tool and forming the material layer.

14. The method for manufacturing a semiconductor device according to claim 12, wherein the head tilt angle θ is determined based on arccos (dot pitch Xdp×nozzle number/a length of the major axis of the head).

15. The method for manufacturing a semiconductor device according to claim 12, wherein after creating the fourth raster data, the fourth raster data is corrected based on a scanning route of the head or the substrate.

16. The method for manufacturing a semiconductor device according to claim 12, wherein a control circuit is connected to the droplet discharging apparatus, and wherein the control circuit copies the circuit design diagram data from design database, and executes a program for automatically converting the circuit design diagram data into the fourth raster data.

17. The method for manufacturing a semiconductor device according to claim 12, wherein the main scanning direction is perpendicular to the sub scanning direction.

18. The method for manufacturing a semiconductor device according to claim 12, wherein the semiconductor device is one selected from the group consisting of a television device, a personal computer, a portable information terminal, a video camera, a digital camera, and a wireless tag.

19. The method for manufacturing a semiconductor device according to claim 12, wherein the substrate is one selected from the group consisting of a glass substrate, a quartz substrate, and a plastic substrate.

20. A method for manufacturing a semiconductor device comprising:

creating first circuit design diagram data for providing a first material layer over a substrate having a thin film integrated circuit by a CAD tool;

converting the first circuit design diagram data into first raster data which determines a discharging position, regarding a dot pitch Xdp in a horizontal direction and a dot pitch Ydp in a perpendicular direction as one unit;

creating second raster data of a dot pitch Ydp/V (V>1) by segmenting the first raster data into V units in a main scanning direction;

thinning an arbitrary discharging number of the second raster data to create third raster data having the same discharging number as the first raster data;

determining a head tilt angle θ between a sub scanning direction and a head major-axis direction of the droplet discharging apparatus provided with a head having a plurality of nozzles;

creating fourth raster data in which discharging timing of each nozzle has been corrected based on the head tilt angle θ;

forming the first material layer over the substrate having a thin film integrated circuit by discharging a droplet based on the fourth raster data, in such a way that the head and the substrate are relatively moved in the main scanning direction or the sub scanning direction while maintaining the head tilt angle θ, and wherein the second raster data creation is so as to increase a data number in the main scanning direction by V times.

21. The method for manufacturing a semiconductor device according to claim 20, further comprising:

creating second circuit design diagram data for providing a second material layer over the first material layer by the CAD tool and forming the second material layer.

22. The method for manufacturing a semiconductor device according to claim 20, wherein the head tilt angle θ is determined based on arccos (dot pitch Xdp×nozzle number/a length of the major axis of the head).

23. The method for manufacturing a semiconductor device according to claim 20, wherein after creating the fourth raster data, the fourth raster data is corrected based on a scanning route of the head or the substrate.

24. The method for manufacturing a semiconductor device according to claim 20, wherein a control circuit is connected to the droplet discharging apparatus, and wherein the control circuit copies the circuit design diagram data from design database, and executes a program for automatically converting the circuit design diagram data into the fourth raster data.

25. The method for manufacturing a semiconductor device according to claim 20, wherein the main scanning direction is perpendicular to the sub scanning direction.

26. The method for manufacturing a semiconductor device according to claim 20, wherein the first material layer is one selected from the group consisting of a conductive layer, a semiconductor layer, a mask layer, and an insulating layer.

27. The method for manufacturing a semiconductor device according to claim 20, wherein the substrate is one selected from the group consisting of a glass substrate, a quartz substrate, a metal substrate, and a plastic substrate.

28. The method for manufacturing a semiconductor device according to claim 20, wherein the semiconductor device is one selected from the group consisting of a television device, a personal computer, a portable information terminal, a video camera, a digital camera, and a wireless tag.

29. A method for manufacturing a semiconductor device comprising:

creating first circuit design diagram data for providing a wiring over a substrate having a thin film integrated circuit by a CAD tool;

converting the first circuit design diagram data into first raster data which determines a discharging position, regarding a dot pitch Xdp in a horizontal direction and a dot pitch Ydp in a perpendicular direction as one unit;

creating second raster data of a dot pitch Ydp/V (V>1) by segmenting the first raster data into V units in a main scanning direction;

thinning an arbitrary discharging number of the second raster data to create third raster data having the same discharging number as the first raster data;

determining a head tilt angle θ between a sub scanning direction and a head major-axis direction of the droplet discharging apparatus provided with a head having a plurality of nozzles;

creating fourth raster data in which discharging timing of each nozzle has been corrected based on the head tilt angle θ;

forming the wiring over the substrate having a thin film integrated circuit by discharging a droplet based on the fourth raster data, in such a way that the head and the substrate are relatively moved in the main scanning direction or the sub scanning direction while maintaining the head tilt angle θ, and wherein the second raster data creation is so as to increase a data number in the main scanning direction by V times.

30. The method for manufacturing a semiconductor device according to claim 29, further comprising:

creating second circuit design diagram data for providing a material layer over the wiring by the CAD tool and forming the material layer.

31. The method for manufacturing a semiconductor device according to claim 29, wherein the head tilt angle θ is determined based on arccos (dot pitch Xdp×nozzle number/a length of the major axis of the head).

32. The method for manufacturing a semiconductor device according to claim 29, wherein after creating the fourth raster data, the fourth raster data is corrected based on a scanning route of the head or the substrate.

33. The method for manufacturing a semiconductor device according to claim 29, wherein a control circuit is connected to the droplet discharging apparatus, and wherein the control circuit copies the circuit design diagram data from design database, and executes a program for automatically converting the circuit design diagram data into the fourth raster data.

34. The method for manufacturing a semiconductor device according to claim 29, wherein the main scanning direction is perpendicular to the sub scanning direction.

35. The method for manufacturing a semiconductor device according to claim 29, wherein the substrate is one selected from the group consisting of a glass substrate, a quartz substrate, a metal substrate, and a plastic substrate.

36. The method for manufacturing a semiconductor device according to claim 29, wherein the semiconductor device is one selected from the group consisting of a television device, a personal computer, a portable information terminal, a video camera, a digital camera, and a wireless tag.

37. A method for manufacturing a semiconductor device comprising:

creating first circuit design diagram data for providing an antenna over a substrate having a thin film integrated circuit by a CAD tool;

converting the first circuit design diagram data into first raster data which determines a discharging position, regarding a dot pitch Xdp in a horizontal direction and a dot pitch Ydp in a perpendicular direction as one unit;

creating second raster data of a dot pitch Ydp/V (V>1) by segmenting the first raster data into V units in a main scanning direction;

thinning an arbitrary discharging number of the second raster data to create third raster data having the same discharging number as the first raster data;

determining a head tilt angle $\theta$ between a sub scanning direction and a head major-axis direction of the droplet discharging apparatus provided with a head having a plurality of nozzles;

creating fourth raster data in which discharging timing of each nozzle has been corrected based on the head tilt angle $\theta$;

forming the antenna over the substrate having a thin film integrated circuit by discharging a droplet based on the fourth raster data, in such a way that the head and the substrate are relatively moved in the main scanning direction or the sub scanning direction while maintaining the head tilt angle $\theta$, and wherein the second raster data creation is so as to increase a data number in the main scanning direction by V times.

38. The method for manufacturing a semiconductor device according to claim 37, further comprising:

creating second circuit design diagram data for providing a material layer over the antenna by the CAD tool and forming the material layer.

39. The method for manufacturing a semiconductor device according to claim 37, wherein the head tilt angle $\theta$ is determined based on arccos (dot pitch Xdp×nozzle number/a length of the major axis of the head).

40. The method for manufacturing a semiconductor device according to claim 37, wherein after creating the fourth raster data, the fourth raster data is corrected based on a scanning route of the head or the substrate.

41. The method for manufacturing a semiconductor device according to claim 37, wherein a control circuit is connected to the droplet discharging apparatus, and wherein the control circuit copies the circuit design diagram data from design database, and executes a program for automatically converting the circuit design diagram data into the fourth raster data.

42. The method for manufacturing a semiconductor device according to claim 37, wherein the main scanning direction is perpendicular to the sub scanning direction.

43. The method for manufacturing a semiconductor device according to claim 37, wherein the substrate is one selected from the group consisting of a glass substrate, a quartz substrate, a metal substrate, and a plastic substrate.

44. The method for manufacturing a semiconductor device according to claim 37, wherein the semiconductor device is one selected from the group consisting of a portable information terminal, a wireless chip, a wireless processor, a wireless memory, and a wireless tag.

* * * * *